(12) United States Patent
Kishioka et al.

(10) Patent No.: US 10,025,432 B2
(45) Date of Patent: Jul. 17, 2018

(54) CAPACITIVE TOUCH PANEL

(75) Inventors: Hiroaki Kishioka, Ibaraki (JP); Mayumi Kishioka, legal representative, Ibaraki (JP); Tomohide Banba, Ibaraki (JP); Mitsuru Honjo, Ibaraki (JP); Naoki Nagaoka, Ibaraki (JP); Kazumasa Igarashi, Ibaraki (JP); Yuki Hasegawa, Ibaraki (JP); Hiroshi Wada, Ibaraki (JP); Yuki Tsubaki, Ibaraki (JP); Tomotake Nashiki, Ibaraki (JP)

(73) Assignee: NITTO DENKO CORPORATION, Ibaraki-Shi, Osaka (JP)

( * ) Notice: Subject to any disclaimer, the term of this patent is extended or adjusted under 35 U.S.C. 154(b) by 491 days.

(21) Appl. No.: 14/128,442

(22) PCT Filed: Jun. 20, 2012

(86) PCT No.: PCT/JP2012/065702
§ 371 (c)(1),
(2), (4) Date: Jun. 16, 2014

(87) PCT Pub. No.: WO2012/176789
PCT Pub. Date: Dec. 27, 2012

(65) Prior Publication Data
US 2015/0029412 A1    Jan. 29, 2015

(30) Foreign Application Priority Data
Jun. 20, 2011   (JP) .................................. 2011-136150

(51) Int. Cl.
*G06F 3/044* (2006.01)
*C09J 133/08* (2006.01)
(Continued)

(52) U.S. Cl.
CPC .............. *G06F 3/044* (2013.01); *B23B 27/08* (2013.01); *B32B 7/12* (2013.01); *B32B 27/283* (2013.01);
(Continued)

(58) Field of Classification Search
USPC ...................... 345/173–178; 178/18.01–20.01
See application file for complete search history.

(56) References Cited

U.S. PATENT DOCUMENTS

2003/0168166 A1* 9/2003 Wigdorski ............ C08F 220/18
156/330
2003/0199655 A1* 10/2003 Yurugi .................. C08F 220/40
526/320

(Continued)

FOREIGN PATENT DOCUMENTS

| CN | 1926452 A | 3/2007 |
| CN | 101162418 A | 4/2008 |

(Continued)

OTHER PUBLICATIONS members.tm.net.*
(Continued)

*Primary Examiner* — Chad Dicke
(74) *Attorney, Agent, or Firm* — Hauptman Ham, LLP

(57) ABSTRACT

Provided is a capacitive touch panel which has enhanced sensitivity and is usable in an image display panel, etc. in this capacitive touch panel, a window, a first transparent film having a first transparent conductive electrode pattern formed on one surface thereof, and a second transparent film having a second transparent conductive electrode pattern which is formed on one surface thereof and disposed with respect to the first transparent film in such a manner as to allow a capacitance to be formed therebetween, are stacked in turn. The capacitive touch panel comprises a first trans-
(Continued)

parent inter-layer resin provided between the window and the first transparent film, and a second transparent inter-layer resin provided between the first transparent film and the second transparent film, wherein the first transparent inter-layer resin has a dielectric constant greater than that of the second transparent inter-layer resin.

20 Claims, 1 Drawing Sheet

(51) Int. Cl.
| | |
|---|---|
| G02F 1/1333 | (2006.01) |
| H03K 17/96 | (2006.01) |
| B32B 7/12 | (2006.01) |
| B23B 27/08 | (2006.01) |
| B32B 27/28 | (2006.01) |
| B32B 27/30 | (2006.01) |
| B32B 27/34 | (2006.01) |
| B32B 27/36 | (2006.01) |
| B32B 27/40 | (2006.01) |
| C09J 7/24 | (2018.01) |
| H01L 27/32 | (2006.01) |

(52) U.S. Cl.
CPC ............ *B32B 27/308* (2013.01); *B32B 27/34* (2013.01); *B32B 27/36* (2013.01); *B32B 27/40* (2013.01); *C09J 7/24* (2018.01); *C09J 133/08* (2013.01); *G02F 1/13338* (2013.01); *H03K 17/962* (2013.01); *B32B 2307/202* (2013.01); *B32B 2307/412* (2013.01); *B32B 2457/20* (2013.01); *B32B 2457/208* (2013.01); *C09J 2203/318* (2013.01); *C09J 2433/00* (2013.01); *C09J 2433/006* (2013.01); *H01L 27/323* (2013.01)

(56) References Cited

U.S. PATENT DOCUMENTS

| | | | |
|---|---|---|---|
| 2005/0156906 A1 | 7/2005 | Chiu et al. | |
| 2008/0100592 A1 | 5/2008 | Shigeno et al. | |
| 2008/0138589 A1* | 6/2008 | Wakabayashi | G06F 3/044 428/195.1 |
| 2008/0231793 A1 | 9/2008 | Futamura | |
| 2009/0033636 A1 | 2/2009 | Toyota et al. | |
| 2009/0315859 A1* | 12/2009 | Chien | G06F 3/044 345/175 |
| 2010/0013798 A1* | 1/2010 | Nakajima | G06F 3/044 345/176 |
| 2010/0196669 A1* | 8/2010 | Hatakenaka | C09J 7/0207 428/172 |
| 2010/0265211 A1 | 10/2010 | Oishi et al. | |
| 2010/0271048 A1* | 10/2010 | Kouno | G06F 3/044 324/658 |
| 2012/0070614 A1* | 3/2012 | Takahashi | G02B 5/0221 428/141 |
| 2012/0162134 A1* | 6/2012 | Chen | G09G 3/3648 345/174 |
| 2012/0241199 A1* | 9/2012 | Kobayashi | G06F 3/044 174/250 |
| 2012/0241408 A1 | 9/2012 | Misaki et al. | |

FOREIGN PATENT DOCUMENTS

| | | |
|---|---|---|
| CN | 101359907 A | 2/2009 |
| JP | 2003-114762 A | 4/2003 |
| JP | 2008-009921 A | 1/2008 |
| JP | 2009037373 | 2/2009 |
| JP | 2009070191 | 4/2009 |
| JP | 2010176571 | 8/2010 |
| JP | 2010267251 | 11/2010 |
| JP | 2011170511 | 9/2011 |
| KR | 1020110041300 A | 4/2011 |
| TW | 200523804 A | 7/2005 |
| WO | 2010/147047 A1 | 12/2010 |
| WO | 2011065292 A1 | 6/2011 |

OTHER PUBLICATIONS

Japanese Office Action for application No. JP2011-136150 dated Feb. 9, 2015.
Chinese Office Action for application No. CN201310279318.3 dated Feb. 4, 2015.
Chinese Search Report for application No. CN201310279318.3 dated Jan. 15, 2015.
Taiwanese Office Action and Search Report for application No. TW101121920 dated Feb. 13, 2015.
International Search Report dated Sep. 11, 2012 for PCT/JP2012/065702.
Chinese Office Action dated Oct. 10, 2015.

\* cited by examiner

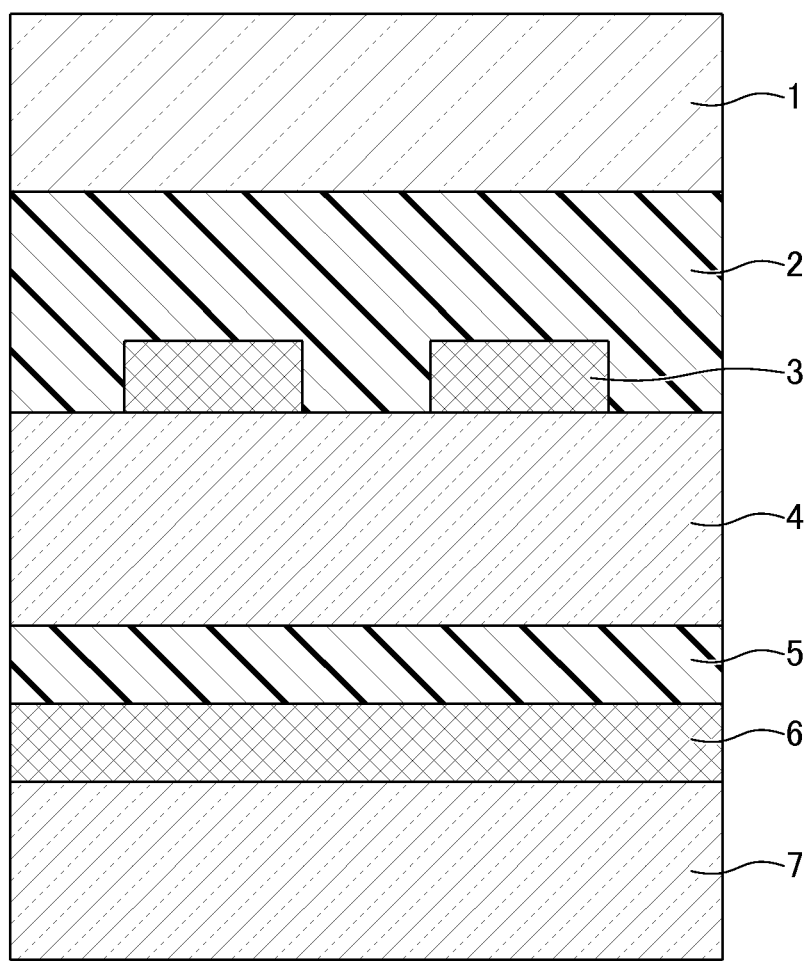

CAPACITIVE TOUCH PANEL

CROSS REFERENCE TO RELATED APPLICATION

This application claims the priority of Japanese Patent Application No. 2011-136150, filed on Jun. 20, 2011 in the Japanese Patent and Trademark Office. Further, this application is the National Phase application of International Application No. PCT/JP2012/065702 filed on Jun. 20, 2012, which is incorporated herein by reference in its entirety.

TECHNICAL FIELD

The present invention relates to a capacitive touch panel, and an image display panel having the capacitive touch panel. In particular, the present invention relates to a capacitive touch panel with enhanced detection sensitivity, and an image display panel having the capacitive touch panel.

BACKGROUND ART

A touch panel for touch input is widely applied in an image display panel for use in an optical display device for televisions, mobile phones, personal digital assistances and others, etc. There are various types of touch panels, such as a resistive (resistive film) type and a capacitive type. The resistive touch panel comprises two upper and lower transparent electrodes such as ITO electrodes, wherein it is configured such that, when the upper electrode is pressed by a finger or the like, the two electrodes come into press contact with each other to cause current to pass therebetween, and a resulting generated current is detected by a sensor, thereby detecting a pressed position. The capacitive touch panel is configured such that, when a user's finger touches a window of the touch panel, a capacitance is formed between the finger and a (transparent) electrode of the touch panel, and a resulting change in capacitance is used to detect a touched position.

According to a configuration of an electrode, the capacitive touch panel can be classified into a surface capacitive type in which a sensor electrode is formed as a single sheet, and a projected capacitive type in which a sensor electrode consists of a group of X-electrode lines and a group of Y-electrode lines which are arranged to intersect each other to form a grid pattern. The projected capacitive touch panel is further classified into a self-capacitance detection type in which the X-axis electrode lines and Y-axis electrodes are scanned independently to detect individual capacitance changes, and a mutual-capacitance detection type in which the group of X-electrode lines and the group of Y-electrode lines are configured, respectively, as a transmitting electrode and a receiving electrode, and a capacitance change at each adjacent position between the X- and Y-electrode lines is detected.

As compared to the self-capacitance detection type, the mutual-capacitance detection type is considered to be advantageous in that: there is no unclarity (uncertainty) in detection of coordinates even in particular usage such as multi-touch, because it is configured to detect a capacitance change at each intersection between the X- and Y-electrode lines; the detection can be performed in an easy and high-speed manner, because it is configured to detect only a coupling capacitance while separating input and output terminals from each other; and it is possible to reduce a required memory capacity, and ease a burden on hardware, and gust is less likely to occur, because the detection is performed by scanning in either one of two axial direction.

As regards such a capacitive touch panel, higher performance is required. In particular, there is a need for a capacitive touch panel with enhanced detection sensibility.

Heretofore, there have been made various attempts to improve a capacitive touch panel to have higher performance, with a focus on permittivities of various portions constituting the capacitive touch panel.

JP 2009-37373A relates a technique intended to suppress the occurrence of erroneous input due to a change in capacitance of a sensor electrode adjacent to a desired sensor electrode, and discloses providing a plurality of first blocks each disposed in contact with respective central regions of a plurality of sensor electrodes, and a plurality of second blocks each disposed between adjacent ones of the first blocks, wherein the second block has a dielectric constant less than that of the first block.

JP 2009-70191A relates to a technique intended to provide a capacitance sensor having an extremely fine electrode pattern formed with high degree of accuracy, and discloses providing a dielectric constant adjusting layer between a first transparent layer having a first electrode pattern arranged on a surface thereof, and a second transparent layer having a second electrode pattern arranged on a surface thereof.

JP 2010-176571A relates a technique intended to realize a projected capacitive touch panel capable of enhancing coordinate detection system, and disclosed that a dielectric constant of an adhesive existing between a first electrode pattern and a second electrode pattern has a given relationship with a dielectric constant of the first and second electrode patterns.

LIST OF PRIOR ART DOCUMENTS

Patent Documents

Patent Document 1: JP 2009-37373A
Patent Document 2: JP 2009-70191A
Patent Document 3: JP 2010-176571A

SUMMARY OF THE INVENTION

Technical Problem

The inventors of this application found that, in a capacitive touch panel comprising two electrode layers arranged to allow a capacitance to be formed therebetween, and a window provided on an upper side of the electrode layers, a magnitude relationship between respective permittivities of a layer interposed between the window and an upper one of the electrodes (first transparent inter-layer resin) and a layer interposed between the two electrodes exerts an influence on sensitivity of the capacitive touch panel (second transparent inter-layer resin), which is not disclosed in any of the above Patent Documents. Generally, each of the first transparent inter-layer resin and the second transparent inter-layer resin is an adhesive or a pressure-sensitive adhesive, and it has heretofore been commonly believed that, in view of process or cost performance, the same material is used for both of the first and second transparent inter-layer resin, and there is no reason for using different materials. With a focus on founding that, in the case where the dielectric constant of the first transparent inter-layer resin is greater than the dielectric constant of the second transparent inter-layer resin, a change in capacitance occurring when a user's finger touches the window of the touch panel becomes larger, and thus the sensitivity of the capacitive touch panel is enhanced, the inventors have accomplish the present invention.

It is an object of the present invention to provide a capacitive touch panel having enhanced sensitivity and usable in an image display panel, etc.

Solution to the Technical Problem

In order to solve the above technical problem, according to a first aspect of the present invention, there is provided a capacitive touch panel in which a window, a first transparent film having a first transparent conductive electrode pattern formed on one surface thereof, and a second transparent film having a second transparent conductive electrode pattern which is formed on one surface thereof and disposed with respect to the first transparent film in such a manner as to allow a capacitance to be formed therebetween, are stacked in turn. The capacitive touch panel comprises a first transparent inter-layer resin provided between the window and the first transparent film, and a second transparent inter-layer resin provided between the first transparent film and the second transparent film, wherein the first transparent inter-layer resin has a dielectric constant greater than that of the second transparent inter-layer resin.

In the first aspect of the present invention, each of the dielectric constant of the first transparent inter-layer resin and the dielectric constant of the second transparent inter-layer resin is preferably in the range of 2 to 8.

Further, the dielectric constant of the first transparent inter-layer resin is greater than the dielectric constant of the second transparent inter-layer resin preferably by at least 30% thereof, more preferably, by at least 40% thereof.

Further, each of the first transparent inter-layer resin and the second transparent inter-layer resin preferably has a thickness of 25 μm or more.

In the first aspect of the present invention, the first transparent conductive electrode pattern may be formed on a surface of the first transparent film on the side of the window, and the second transparent conductive electrode pattern may be formed on a surface of the second transparent film on the side of the window. Alternatively, the first transparent conductive electrode pattern may be formed on a surface of the first transparent film on the side of the window, and the second transparent conductive electrode pattern may be formed on a surface of the second transparent film on a side opposite to the window.

In the first aspect of the present invention, at least one of the first transparent inter-layer resin and the second transparent inter-layer resin may be a cured body of an ultraviolet-curable liquid resin.

In this case, the ultraviolet-curable liquid resin preferably has a viscosity of 100,000 mPas to 500 mPas.

Further, the ultraviolet curable liquid resin is preferably comprised of an ultraviolet-curable optical resin adhesive composition comprising: a urethane acrylate-based polymer containing a (meth)acryloyl group and a hydroxyl group on side chains thereof; and a photopolymerization initiator.

Further, the urethane acrylate-based polymer preferably has a weight-average molecular weight of 5,000 to 500,000.

Further, the ultraviolet-curable optical resin adhesive composition preferably comprises a monofunctional (meth) acrylate compound as a reactive diluent.

In the first aspect of the present invention, at least one of the first transparent inter-layer resin and the second transparent inter-layer resin may be composed of a pressure-sensitive adhesive.

In this case, the pressure-sensitive adhesive is preferably selected from the group consisting of an acryl-based pressure-sensitive adhesive, a rubber-based pressure-sensitive adhesive, a vinyl alkyl ether-based pressure-sensitive adhesive, a silicone-based pressure-sensitive adhesive, a polyester-based pressure-sensitive adhesive, a polyamide-based pressure-sensitive adhesive, a urethane-based pressure-sensitive adhesive, a fluorine-based pressure-sensitive adhesive, an epoxy-based pressure-sensitive adhesive, a polyether-based pressure-sensitive adhesive, and mixtures thereof.

Further, when the first transparent inter-layer resin is composed of a pressure-sensitive adhesive, the pressure-sensitive adhesive of the first transparent inter-layer resin preferably comprises a polymer formed from a monomer component selected from the group consisting of (meth)acrylate, methyl acrylate, ethyl acrylate and butyl acrylate each containing an alkoxyl group and/or a hydroxyl group.

Further, when the second transparent inter-layer resin is composed of a pressure-sensitive adhesive, the pressure-sensitive adhesive of the second transparent inter-layer resin preferably comprises a polymer formed from a monomer component which is one or more selected from the group consisting of: an alkyl acrylate ester containing a straight- or branched-chain alkyl group of 6 to 10 carbon atoms; an alkyl methacrylate ester containing a straight- or branched-chain alkyl group of 1 to 10 carbon atoms; a (meth)acrylate ester containing an aromatic or alicyclic hydrocarbon group; a nitrogen-containing monomer; and a fluorine-containing monomer.

Preferably, each of the first transparent inter-layer resin and the second transparent inter-layer resin has a total light transmittance of 90% or more in a visible light wavelength region.

Further, each of the first transparent inter-layer resin and the second transparent inter-layer resin preferably has a haze of 3% or less.

According to a second aspect of the present invention, there is provided an image display panel which comprises the capacitive touch panel according to the first aspect of the present invention, and a liquid crystal panel laminated to the capacitive touch panel.

According to a third aspect of the present invention, there is provided an image display panel which comprises the capacitive touch panel according to the first aspect of the present invention, and an organic EL panel laminated to the capacitive touch panel.

BRIEF DESCRIPTION OF THE DRAWINGS

FIG. 1 is a schematic diagram illustrating a cross-section of a capacitive touch panel according to one embodiment of the present invention.

DESCRIPTION OF EMBODIMENTS

The present invention will now be described in detail based on an embodiment thereof. It should be understood that the present invention is not limited to this embodiment.

1. Window

A window for use in the present invention may be a type made of an inorganic material represented by glass, or an organic material such as an acryl-based or polycarbonate-based resin. Evaluating them in terms of strength and a situation of supply in the market, glass is preferable.

A thickness of the window is in the range of about 100 µm to about 2 mm, preferably, about 200 µm to about 1.5 mm. In terms of sensitivity of a capacitive touch panel, smaller thickness of the window is better. However, if the thickness is less than 100 µm, strength becomes insufficient, so that the window is likely to be damaged due to finger touch, etc. On the other hand, if the thickness is excessively large, e.g., 2 mm or more, $C_{finger}$ which is a capacitance between a receiving-side ITO electrode and a transmitting-side ITO electrode after finger touch onto the touch panel is reduced, and the reduction in capacitance is likely to cause deterioration in sensitivity of the capacitive touch panel.

A dielectric constant of the window is preferably in the range of 3 to 10, more preferably, in the range of 4 to 8. If the dielectric constant is excessively low, $C_{finger}$ which is a capacitance between the receiving-side ITO electrode and the transmitting-side ITO electrode after finger touch onto the touch panel is reduced, and the reduction in capacitance is likely to cause deterioration in sensitivity of the capacitive touch panel. In terms of the sensitivity of the capacitive touch panel, higher dielectric constant of the window is better. However, it becomes difficult to find a material additionally having transparency, mechanical strength and processability. For example, dielectric constants of quartz glass, Pyrex (trademark) glass, flint glass, and soda glass, are, respectively, 4, 4.8, 6.9, and 7.4.

As used in this specification, the term "dielectric constant" means relative permittivity at 100 kHz,

2. Transparent Conductive Electrode Pattern

A material for a transparent conductive electrode pattern for use in the present invention is not particularly limited, but it is possible to use: an inorganic oxide of at least one metal (or metalloid) selected from the group consisting of indium, tin, zinc, gallium, antimony, titanium, silicon, zirconium, magnesium, aluminum, gold, silver, copper, palladium and tungsten; an organic substance, such as polyaniline, fullerene, carbon nanotube or graphene; and an organism mixed with an electrically conductive filler comprising fine particles or acicular substances, for example, of silver.

When needed, the above oxide may additionally contain at least one of the remaining metal elements in the group, or an oxide thereof. For example, a tin oxide-containing indium, oxide or an antimony-containing tin oxide is preferably used.

For example, in the case of an ITO (Indium-Tin Oxide) consisting of an indium oxide and a tin oxide, the thickness of the transparent conductive electrode pattern is preferably in the range of 15 to 30 nm. Further, in order to allow the transparent conductive electrode pattern to be formed as a continuous coating having excellent conductive properties, i.e., exhibiting a surface resistance of $1\times10^3 \Omega/\square$ or less, the thickness is preferably 20 nm or more.

3. Transparent Film

A transparent film for use in the present invention is not particularly limited, but it is possible to use various plastic films having transparency, e.g., various optical films, such as an anti-reflection (AR) film, a polarizing plate and a retardation film. Examples of a material for the plastic film include: a polyester-based resin, such as polyethylene terephthalate (PET); a (meth)acryl-based resin, such as polymethylmethacrylate (PMMA); an acetate-based resin; a polyether sulfone-based resin; a polycarbonate-based resin, a polyamide-based resin; a polyimide resin; a polyvinyl chloride-based resin; a polyvinylidene chloride-based resin; polystyrene-based resin; a polyvinyl alcohol-based resin; a polyarylate-based resin; a polyphenylene sulfide-based resin; a polysulphone-based resin; a cellulose-based resin, such as triacetylcellulose; and a polyolefin-based resin, such as a cyclic olefin-based polymer, e.g., trade name "ARTON" (cyclic olefin-based polymer; manufactured by JSR Corporation)", or trade name "ZEONOR" (cyclic olefin-based polymer; manufactured by ZEON Corporation)". Evaluating them in terms of cost, the polyester-based resin, the polycarbonate-based resin and the polyolefin-based resin are preferable. The above plastic materials for the transparent film may be used independently or in the form of a combination of two or more thereof.

The transparent film for use in the present invention preferably has a total light transmittance of 86% or more in a visible light wavelength range (as measured in accordance with JIS K 7136). It is more preferably equal to or greater than 88%, further preferably, equal to or greater than 90%. In the case of a touch panel is feinted using the transparent conductive film of the present invention, as long as a transparent film substrate has an optical transmittance of 86% or more, it becomes possible to obtain a sufficiently bright display and excellent optical properties.

A haze (according to JIS K 7136) of the transparent film is not particularly limited, but is preferably equal to or less than 3.0% (e.g., in the range of 0.1 to 3.0%), more preferably, equal to or less than 2.0% (e.g., in the range of 0.1 to 2.0%). This is because it is preferable to have high transparency in view of visibility of the capacitive touch panel of the present invention.

The transparent film may be an optical element.

A thickness of the transparent film is preferably in the range of 2 to 200 µm, more preferably, in the range of 20 to 150 µm. This is because it becomes possible to facilitate a reduction in thickness (thinning) of the film while ensuring mechanical strength thereof. The transparent film may be in the form of a single layer or may be in the form of a multi-layer. A surface of the transparent film may be subjected to an appropriate surface treatment, for example, a physical treatment such as a corona discharge treatment or a plasma merit, or a chemical treatment such as a primer coating treatment.

A dielectric constant of the transparent film is preferably set to a lower value as much as possible, in view of a fact that $C_{ITO}$ which is a capacitance between the receiving-side no electrode and the transmitting-side ITO electrode before finger touch onto the touch panel is reduced accordingly, so that it becomes possible to enhance the sensitivity of the capacitive touch panel. The dielectric constant is preferably in the range of 1.5 to 7, more preferably, in the range of 2 to 5. Among the aforementioned plastic materials, for example, dielectric constants of PET, a polycarbonate resin, and a polyolefin resin (ZEONOR), are, respectively, 3.2, 3.1, and 2.4.

4. Transparent Inter-Layer Resin

The capacitive touch panel of the present invention is characterized in that it comprises a first transparent inter-layer resin provided between a window and a first transparent film, and a second transparent inter-layer resin provided between the first transparent film and a second transparent film, wherein the first transparent inter-layer resin has a dielectric constant greater than that of the second transparent inter-layer resin.

The dielectric constant of the first transparent inter-layer resin is greater than the dielectric constant of the second transparent inter-layer resin by at least 30% thereof, preferably, by 40% or more thereof.

The dielectric constant of each of the transparent inter-layer resins thr use in the present invention is preferably in the range of 2 to 8.

[4-1. Liquid Inter-Layer Resin]

The transparent inter-layer resin for use in the present invention may be formed from a liquid resin (liquid inter-layer filling resin).

That is, in the capacitive touch panel of the present invention usable in an image display such as a liquid crystal panel or an organic EL panel, a liquid resin can be used to fill an interspace between the window and the first transparent film with the transparent conductive electrode pattern, and an interspace between the first transparent film with the transparent conductive electrode pattern and the second transparent film with the transparent conductive electrode pattern.

In the case where the transparent inter-layer resin in the present invention is composed of a liquid resin, an ultraviolet-curable optical resin adhesive composition may be used as the liquid resin. In this case, an ultraviolet-curable optical resin adhesive composition obtained using a specific urethane acrylate-based polymer (component A) and a photopolymerization initiator (component B) is suitably used, as described in detail below.

The specific urethane acrylate-based polymer (component A) has a (meth)acryloyl group and a hydroxyl group on side chains thereof, and is obtained, for example, by reacting a vinyl polymer containing a hydroxyl group on a side chain thereof (side-chain hydroxyl group-containing vinyl polymer), with (meth)acryloyl group-containing monoisocyanate compounds and a diisocyanate type compound.

As used in this specification, the terms "(meth)acryloyl", "(meth)acrylate", "(meth)acrylic acid", and "(meth)acryloxy" mean: acryloyl or methacryloyl; acrylate or methacrylate; acrylic acid or methacrylic acid; and acryloxy or methacryloxy, respectively.

The above side-chain hydroxyl group-containing vinyl polymer may be obtained, for example, by a high-temperature continuous polymerization process using a hydroxyl group-containing vinyl monomer, a hydroxyl group-free vinyl monomer and other vinyl monomers. Preferably, the side-chain hydroxyl group-containing vinyl polymer is a liquid random copolymer having a weight-average molecular weight of 500 to 20,000 and a hydroxyl equivalent (OHV) of about 5 to 200 mg KOH/g. Specific examples of the vinyl polymer include those described, for example, in JP 07-101902A and JP 2001-348560A.

As the hydroxyl group-containing vinyl monomer, hydroxyl group-containing (meth)acrylate is used, and examples thereof include 2-hydroxyethyl(meth)acrylate, 4-hydroxybutyl(meth)acrylate, hydroxypropyl(meth)acrylate, pentaerythritol(meth)acrylate, and glycerin(meth)acrylate. Those may be used independently or in the form of a combination of two or more thereof. Evaluating them in terms of superiority in random copolymerizability, it is preferable to use a hydroxyethyl(meth)acrylate.

As the hydroxyl group-free vinyl monomer, a (meth)acrylate ester is used, and examples thereof include monofunctional (meth)acrylates, such as methyl(meth)acrylate, ethyl(meth)acrylate, propyl(meth)acrylate, isopropyl(meth)acrylate, butyl(meth)acrylate, isobutyl(meth)acrylate, t-butyl(meth)acrylate, isooctyl(meth)acrylate, neopentyl(meth)acrylate, 2-ethylhexyl(meth)acrylate, isodecyl(meth)acrylate, lauryl(meth)acrylate, styryl(meth)acrylate, isobonyl(meth)acrylate, dicyclopentanyl(meth)acrylate, tricyclodecyl(meth)acrylate, tetrahydrofurfuryl(meth)acrylate, glycidyl(meth)acrylate, cyclohexyl(meth)acrylate, 2-methoxyethyl(meth)acrylate, dimethylaminoethyl(meth)acrylate, chloroethyl(meth)acrylate, and trifluoroethyl(meth)acrylate. These may be used may be used independently or in the form of a combination of two or more thereof. Evaluating them in terms of a capability of satisfying both of flexibility and tack-freeness in a resulting cured body, it is preferable to use butyl(meth)acrylate, 2-ethylhexyl(meth)acrylate, lauryl(meth)acrylate, and cyclohexyl(meth)acrylate, in each of which (meth)acrylate ester residues have 1 to 20 carbon atoms.

Examples of the above other vinyl monomers include crotonic acid esters, α-olefins, chloroethylenes, vinyl ethers, vinyl esters, isopropenyl ethers, allyl ethers, allyl esters, an aromatic vinyl monomer, and (meth)acrylic acid. Those may be used independently or in the form of a combination of two or more thereof.

A usage ratio between the hydroxyl group-containing vinyl monomer and the hydroxyl group-free vinyl monomer may be determined by arbitrarily setting a mixing ratio between respective monomers to be subjected to reaction, so as to allow a resulting side-chain hydroxyl group-containing vinyl polymer to become a liquid random copolymer having a hydroxyl equivalent (OHV) of about 5 to 200 mg KOH/g. This is because, if the hydroxyl equivalent (OHV) is excessively small, a resulting cured body of the ultraviolet-curable optical resin adhesive composition becomes insufficient in crosslinking density, so that a situation is observed in which the cured body is likely to become insufficient in strength, and is liable to fail to bring out sufficient transparency, adhesive resistance and solvent/chemical resistance. On the other hand, if the hydroxyl equivalent (OHV) is excessively large, a resulting cured body of the ultraviolet-curable optical resin adhesive composition is likely to have a high glass transition temperature (Tg), so that a situation is observed in which an elastic modulus of the cured body is liable to become higher, thereby failing to bring out sufficient adhesiveness.

The side-chain hydroxyl group-containing vinyl polymer obtainable using the above monomers is prepared by a continuous polymerization process at a high temperature (e.g., 150 to 350° C.), as a vinyl polymer having a weight-average molecular weight of 500 to 20,000. Evaluating them in terms of coating properties, and strength, adhesiveness, weather resistance and solvent/chemical resistance, a liquid vinyl polymer having a weight-average molecular weight of 1,000 to 15,000 is preferable. As used in this specification including the above description, the term "weight-average molecular weight" means a polystyrene-equivalent weight-average molecular weight as measured by gel permeation chromatography (GPC).

Regarding the (meth)acryloyl group-containing monoisocyanate compounds usable in the present invention, examples thereof include (meth)acryloxyisocyanate compounds, such as 2-isocyanatoethyl methacrylate, 2-isocyanatoethyl acrylate, and 1,1-bis(acryloxymethyl)ethyl isocyanate. These may be used independently or in the form of a combination of two or more thereof. Evaluating them in terms of a capability of satisfying both of hardness and tack-freeness in a resulting cured body, it is preferable to use 2-isocyanatoethyl methacrylate.

Regarding the diisocyanate-type compound usable in the present invention, examples thereof include hexamethylene diisocyanate, norbornene diisocyanate, isophorone diisocyanate, xylylene diisocyanate, hydrogenated xylylene diisocyanate, dicyclohexylmethane diisocyanate, tolylene diisocyanate, diphenylmethane diisocyanate, and naphthalene diisocyanate. These may be used independently or in the form of a combination of two or more thereof. Evaluating them in terms of minimization of yellow discoloration in a resulting cured product, it is preferable to use saturated diisocyanates, such as hexamethylene diisocyanate, norbornene diisocyanate, isophorone diisocyanate, hydrogenated xylylene diisocyanate, and dicyclohexylmethane diisocyanate.

As above, the specific acrylate-based polymer (A component) suitably usable in the present invention is obtained by reacting a side-chain hydroxyl group-containing vinyl polymer, with (meth)acryloyl group-containing monoisocyanate compounds and a diisocyanate-type compound. More specifically, the synthesis is performed by inducing the reaction in an inert gas atmosphere at room temperature (about 20° C.), in some cases, under heating at 30 to 80° C., in the presence of a catalyst such as a metal such as titanium or tin, or an organic metal salt such as dibutyltin laurate, to obtain a side-chain (meth)acryloyl group and hydroxyl group-containing acrylate-based polymer which is viscous at about room temperature (25±15° C.).

The (meth)acryloyl group and hydroxyl group-containing urethane acrylate-based polymer (A) can be Obtained in the following manner. The two types of isocyanate compounds are combined with the side-chain hydroxyl group-containing vinyl polymer, in such a manner that, with respect to the number of hydroxyl groups in the side-chain hydroxyl group-containing vinyl polymer, at least 5 to 50% of the hydroxyl groups remain, i.e., the number of isocyanate groups in the (meth)acryloyl group-containing monoisocyanate compounds and the number of isocyanate groups in the diisocyanate-type compound fall, respectively, within the range of 0.1 to 50% and within the range of 30 to 70%, and then they are subjected to reaction in the above manner, so that a side-chain (meth)acryloyl group and hydroxyl group-containing urethane acrylate-based polymer is Obtained. More preferably, the two types of isocyanate compounds are combined with the side-chain hydroxyl group-containing vinyl polymer, in such a manner that at least 10 to 40% of the hydroxyl groups remain, i.e., the number of isocyanate groups in the (meth)acryloyl group-containing monoisocyanate compounds and the number of isocyanate groups in the diisocyanate-type compound fall, respectively, within the range of 10 to 20% and within the range of 40 to 60%. Further preferably, the two types of isocyanate compounds are combined with the side-chain hydroxyl group-containing vinyl polymer, in such a manner that at least 30 to 40% of the hydroxyl groups remain, i.e., the number of isocyanate groups in the (meth)acryloyl group-containing monoisocyanate compounds and the number of isocyanate groups in the diisocyanate-type compound fall, respectively, within the range of 10 to 15% and within the range of 45 to 55%.

The side-chain (meth)acryloyl group and hydroxyl group-containing urethane acrylate-based polymer, as the specific acrylate-based polymer (component A) obtainable in the above manner, preferably has a weight-average molecular weight of 5,000 to 500,000, and particularly preferably has a weight average molecular weight of 50,000 to 200,000. As above, the side-chain (meth)acryloyl group and hydroxyl group-containing urethane acrylate-based polymer is formed to have a weight-average molecular weight falling within the above range. This is desirable because a resulting cured body of the optical resin adhesive composition using this polymer can attain transparency, adhesion reliability, and durability, and can obtain low curing shrinkage, based on high crosslinking density from superiority in which the cured body additionally has hydroxyl groups capable of enhancing crosslinking sites and adhesiveness, in a molecule thereof. In addition, the cured body has an additional advantage of being able to provide enhanced adhesion reliability. Further, a main chain backbone of the formed cured body is a urethane acrylate-based polymer, so that the cured body is excellent in weather resistance. Furthermore, it becomes possible to select, as a swelling solvent, various solvents which are non-corrosive with respect to a nonpolar cycloolefin polymer (COP) which is a material for forming a diffuser, a retardation film, and a protective film used in a polarizing plate. The term "weight-average molecular weight" means a polystyrene-equivalent weight average molecular weight as measured by gel permeation chromatography (GPC), as mentioned above.

A degree of progress of modification during the synthesis reaction for the specific urethane acrylate-based polymer (component A) can be checked, for example, by measuring a characteristic absorption band derived from an isocyanate group, in an infrared absorption spectrum, because an intensity of the isocyanate group-derived characteristic absorption band (about 2,260 cm$^{-1}$) is reduced along with the progress of the reaction. Further, an end point of the modification in the synthesis reaction can be checked based on a fact that the isocyanate group-derived characteristic absorption band disappears.

The photopolymerization initiator (component B) to be used in combination with the specific urethane acrylate-based polymer (component A) acts as an ultraviolet (UV) curing agent, and various types of photopolymerization initiators such as a photoradical polymerization initiator and a photocationic polymerization initiator may be used. In the present invention, particularly in the case where the transparent conductive electrode pattern is made of ITO (indium tin oxide) or the like, it is more preferable to use the photoradical polymerization initiator in order to avoid corrosion of ITO due to ions (particularly, counter anions) derived from the photopolymerization initiator.

Examples of the photoradical polymerization initiator include 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propane, 2-hydroxy-1-{4-[4-(2-hydroxy-2-methyl-propionyl)-benzyl]phenyl}-2-methyl-propan-1-one, 2-benzyl-2-dimethylamino-1-(4-morpholinophenyl)-butanone-1,2-methyl-1-(4-methylthiophenyl)-2-morpholinopropan-1-one, bis(2,4,6-trimethylbenzoyl)-phenylphosphine oxide, 2,4,6-trimethylbenzoyl-diphenyl-phosphine oxide, bis(η5-2,4-cyclopentadien-1-yl)-bis[2,6-difluoro-3(1H-pyrrol-1-yl)-phenyl]titanium, and 2-hydroxy-1-{4-[4-(2-hydroxy-2-methyl-propionyl)-benzyl]phenyl}-2-methyl-propan-1-one. These may be used independently or in the form of a combination of two or more thereof. Evaluating them in terms of a high curing rate and thick-film curing property, it is preferable to use 2,2-dimethoxy-1,2-diphenylethan-1-one, 1-hydroxy-cyclohexyl-phenyl-ketone, and 2-hydroxy-1-{4-[4-(2-hydroxy-2-methyl-propionyl)-benzyl]phenyl}-2-methyl-propan-1-one.

A mixing amount of the photopolymerization initiator is set preferably in the range of 0.1 to 30 weight %, more preferably, in the range of 0.5 to 20 weight %, with respect to an entirety of the ultraviolet-curable optical resin adhesive composition. This is because, if the mixing amount of the photopolymerization initiator is excessively small, a situation is observed in which a polymerization degree is liable to become insufficient, and, if the mixing amount is excessively large, a situation is observed in which an amount of post-decomposition residue is increased, so that durability of the ultraviolet-curable optical resin adhesive composition is liable to be deteriorated, and the solvent/chemical resistance is also liable to be deteriorated.

The ultraviolet-curable optical resin adhesive composition may contain various monofunctional (meth)acrylate compounds as a reactive diluent. Examples of the monofunctional (meth)acrylate compounds include monofunctional (meth)acrylates, such as methyl(meth)acrylate, ethyl(meth)acrylate, propyl(meth)acrylate, isopropyl(meth)acrylate, butyl(meth)acrylate, isobutyl(meth)acrylate, t-butyl(meth)acrylate, isooctyl(meth)acrylate, neopentyl(meth)acrylate, 2-ethylhexyl(meth)acrylate, isodecyl(meth)acrylate, lauryl(meth)acrylate, styryl(meth)acrylate, isobonyl(meth)acrylate, dicyclopentanyl(meth)acrylate, tricyclodecyl(meth)acrylate, tetrahydrofurfuryl(meth)acrylate, glycidyl(meth)acrylate, cyclohexyl(meth)acrylate, 2-methoxyethyl(meth)acrylate, dimethylaminoethyl(meth)acrylate, chloroethyl(meth)acrylate, trifluoroethyl(meth)acrylate, 2-hydroxyethyl(meth)acrylate, 4-hydroxybutyl(meth)acrylate, hydroxypropyl(meth)acrylate, pentaerythritol(meth)acrylate, and glycerin(meth)acrylate. These may be used independently or in the form of a combination of two or more thereof. Evaluating them in terms of an improvement in adhesion of a resulting cured body, it is preferable to use: tetrahydrofurfuryl(meth)acrylate and glycidyl(meth)acrylate, in each of which a (meth)acrylate ester residue is a cyclic ether; and 2-hydroxyethyl(meth)acrylate, 4-hydroxybutyl(meth)acrylate, hydroxypropyl(meth)acrylate, pentaerythritol(meth)acrylate, and glycerin(meth)acrylate, in each of which a (meth)acrylate ester residue has a hydroxyl group. It is more preferable to use 2-hydroxyethyl(meth)acrylate and tetrahydrofurfuryl(meth)acrylate.

A content of the monofunctional (meth)acrylate compounds as a reactive diluent is preferably in the range of 5 to 200 weight parts, more preferably, in the range of 10 to 100 weight parts, with respect to 100 weight parts of the side-chain (meth)acryloyl group and hydroxyl group-containing urethane acrylate-based polymer (A) suitably usable in the present invention. This is because, if an amount of addition of the monofunctional (meth)acrylate compounds is excessively small, it is difficult to sufficiently obtain an effect of enhancing adhesion of the ultraviolet-curable optical resin adhesive composition, and, if the amount is excessively large, a situation is observed in which a decrease in viscosity occurs, and thus coating properties are liable to be deteriorated.

In the present invention, particularly in the case where the window of the capacitive touch panel of the present invention is made of glass or the like, for enhancing adhesion of the composition, it is effective to add various type of silane coupling agents to the ultraviolet-curable optical resin adhesive composition.

Examples of the silane coupling agent include 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-triethoxy silyl-N-(1,3-dimethyl-butylidene)propylamine, N-phenyl-3-aminopropyltriethoxysilane, N-(vinylbenzyl)-2-aminoethyl-3-aminopropyltrimethoxysilane hydrochloride, 3-ureidopropyltrimethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, and 3-isocyanatopropyltriethoxysilane. These may be used independently or in the form of a combination of two or more thereof. Evaluating them in terms of superiority in durability of adhesion with respect to glass, it is preferable to use 3-methacryloxypropyltriethoxysilane and 3-acryloxypropyltrimethoxysilane An amount of addition of the silane coupling agent is preferably in the range of 0.1 to 10 weight parts, more preferably, in the range of 0.5 to 5 weight parts, with respect to 100 weight parts of a sum of the side-chain (meth)acryloyl group-containing acrylate-based polymer (A) suitably usable in the present invention, and the monofunctional (meth)acrylate compounds as a reactive diluent. This is because, if the amount of addition of the silane coupling agent is excessively small, it is difficult to sufficiently obtain the effect of enhancing adhesion of the ultraviolet-curable optical resin adhesive composition, and, if the amount is excessively large, a situation is observed in which a decrease in viscosity occurs, and thus coating properties are liable to be deteriorated In addition to the above components, the ultraviolet-curable optical resin adhesive composition may be appropriately combined with any other suitable additives, such as an anti-oxidizing agent, an anti-foaming agent, a surfactant, a colorant, an organic filler, various spacers, and a pressure-sensitive adhesion/adhesiveness-imparting agent, on an as-needed basis. These may be used independently or in the form of a combination of two or more thereof.

The ultraviolet-curable optical resin adhesive composition can be produced, for example, by: combining the specific urethane acrylate-based polymer (component A), the photopolymerization initiator (component B) and other components; and subjecting them to mixing and kneading by means of stirring using a planetary centrifugal mixer or a glass stirring vessel.

The ultraviolet-curable optical resin adhesive composition obtained in the above way is used for the intended purpose in the following manner. A high viscous liquid of the ultraviolet-curable optical resin adhesive composition (which preferably has a viscosity of 50,000 to 70,000 mPa·s) is applied along an outer periphery of a joining surface of one of adjacent two panel elements of the window and the first and second transparent films, in the form of a dam, and then slightly cured by ultraviolet using an ultraviolet (UV) lamp, such as a UV LED or a high-pressure mercury lamp, or the like. Subsequently, a low viscous liquid (Which preferably has a viscosity of 2,000 to 3,000 mPa·s) prepared by diluting the ultraviolet-curable optical resin adhesive composition with a monofunctional monomer or the like is applied to fill an inward surface region defined by the dam (inward region of the joining surface) in the one panel element formed with the dam. Then, after aligning the one panel element with the other panel element, the two panel elements are laminated to each other under vacuum or under normal pressure. Then, curing is performed, for example, by ultraviolet irradiation using a UV lamp or the like, in the same manner as that described above. After light irradiation such as the ultraviolet irradiation, the curing may be ensured by performing a post-curing treatment at a given temperature, if necessary.

As a light source for use in the ultraviolet irradiation, it is possible to use various types of heretofore-known light sources, for example, a type capable of effectively emitting ultraviolet rays, such as a carbon-arc lamp, a mercury-vapor arc lamp, an ultra-high pressure mercury lamp, a high-pressure mercury lamp, and a xenon lamp.

In the case of a liquid crystal display, the ultraviolet-curable optical resin adhesive composition may be used in combination with an apparatus for laminating an LCD panel, a window and a touch panel together, to assemble the liquid crystal display through a series of assembling process comprising: input of the window and the LCD panel; application of the adhesive; lamination (under vacuum); preliminary curing based on ultraviolet irradiation; final curing based on ultraviolet irradiation; and extraction. Particularly, it is suited for an assembling process using an auto-alignment function-equipped production apparatus.

In the case where a problem occurs in the above liquid crystal display after the assembling thereof, each adhesive layer is cut using an ultrafine wire to peel of each panel plate, and then residual resin remaining on each peeling surface is swollen and removed using a solvent. Generally, a nonwoven fabric wiper is impregnated with a repairing solvent (swelling solvent), and then statically placed on the residual resin to swell it. As the swelling solvent, considering that it should be non-erosive with respect to a nonpolar cycloolefin polymer (COP), a non-erosive swelling solvent (repairing solvent) may be selected from: a ketone-based solvent, such as methyl isobutyl ketone (MIBK); an ester-based solvent; an ether-based solvent; an ester-based solvent, a cellosolve-based solvent, etc. After removal of the residual resin, the panel plate is cleaned using an alcohol-based solvent, so that it becomes possible to send the panel plate back to the assembling process again.

In the ultraviolet-curable optical resin adhesive composition, a degree of curing can be controlled by an amount of ultraviolet light for irradiation (cumulative light amount). Thus, by preliminarily learning a relationship between the cumulative light amount and a wire-cutting strength, the wire-cutting strength can be set to a desired value, so that it becomes possible to arbitrarily select operation efficiency of reworking (repairing). Further, conditions for curing the ultraviolet-curable optical resin adhesive composition can be estimated by plotting a relationship between a cumulative ultraviolet-light amount and a cumulative generated-heat amount, which allows a desired characteristic value to be obtained. As a guide for stabilization in physical properties of the ultraviolet-curable optical resin adhesive composition, it is preferable to select ultraviolet irradiation conditions for achieving a cumulative light amount corresponding to 90% or more of cumulative generated-heat amount.

A dielectric constant is a material-specific electrical property, and is uniquely determined by a chemical structure of each material.

In regard to a dielectric constant of a dielectric material, the following formula is derived from the well-known Clausius-Mossotti's formula (see, for example, Van Krevelen, D. W, "Properties of Polymers", 232, 590-596, Elsevier Scientific Publishing Company (1970)):

$(\vartheta-1)/(\vartheta+2)=P_{LL}/V$ (wherein: $\vartheta$ represents a dielectric constant; PLL represents a molar polarization (cm³/mol); and V represents a molar volume (cm³/mol).)

While the molar polarization is calculated from a sum of values of atomic polarizability, molecular design is generally performed while taking into account structural factors such as substituent and free volume. Further, it has recently become possible to accurately estimate the dielectric constant by means of computational science.

However, the dielectric constant is influenced by a change in film thickness along with a volume change caused by humidification and dehumidification or residual plasticizer, and electrical impacts of movable ions. Thus, it is important to sufficiently perform moisture management and residue management in order to obtain a desired dielectric constant.

Further, in the capacitive touch panel of the present invention, if there is an interspace between the transparent inter-layer resin and the transparent film, an intended dielectric property of a dielectric material is not brought out. Thus, it is necessary to pay attention to avoid the occurrence of peeling between the transparent inter-layer resin and the transparent film.

Furthermore, the material-specific dielectric constant has temperature and frequency dependences. Thus, in use of the capacitive touch panel of the present invention, it is necessary to pay attention to usage environment (temperature, frequency), etc.

[4-2. Inter-Layer Pressure-Sensitive Adhesive]

The transparent inter-layer resin may be composed of a pressure sensitive adhesive (inter-layer pressure sensitive adhesive).

(4-2-1. Pressure-Sensitive Adhesive Layer)

A base polymer in a pressure-sensitive adhesive usable in the present invention is not particularly limited, but it is possible to appropriately select and use one or more of base polymers in heretofore-known pressure-sensitive adhesives (e.g., an acryl-based pressure-sensitive adhesive, a rubber-based pressure-sensitive adhesive, a vinyl alkyl ether-based pressure-sensitive adhesive, a silicone-based pressure-sensitive adhesive, a polyester-based pressure-sensitive adhesive, a polyamide-based pressure-sensitive adhesive, a urethane-based pressure-sensitive adhesive, a fluorine-based pressure-sensitive adhesive, an epoxy-based pressure-sensitive adhesive, and a polyether-based pressure-sensitive adhesive). These base polymers may be used independently or in the firm of a combination of two or more thereof.

A content of a base polymer in the pressure-sensitive adhesive is preferably equal to or greater than 60 weight % (e.g., in the range of 60 to 100 weight %), more preferably, in the range of 80 to 100 weight %.

In the case where a pressure-sensitive adhesive is used as the transparent inter-layer resin in the present invention, when the pressure-sensitive adhesive is required to have a high dielectric constant or a low dielectric constant, the following material may be used in each case.

(4-2-1-1. High-Dielectric Pressure-Sensitive Adhesive Layer)

The polyether-based pressure-sensitive adhesive layer contains a polyether-based polymer as a base polymer. While the polyether-based polymer is not particularly limited, a polyoxyalkylene-based polymer is preferable.

While the polyoxyalkylene-based polymer is not particularly limited, a type whose main chain has a repeating unit represented by the following general formula (1) is preferable.

  General formula (1)

(wherein R¹ represents an alkylene group.)

R¹ in the general formula (1) is preferably a straight-chain or branched alkylene group of 1 to 14 carbon atoms, more preferably, a straight-chain or branched alkylene group of 2 to 4 carbon atoms.

Specific examples of the repeating unit represented by the general formula (1) include —$CH_2O$—, —$CH_2CH_2O$—, —$CH_2CH(CH_3)O$—, —$CH_2CH(C_2H_5)O$—, —$CH_2C(CH_3)_2O$—, and —$CH_2CH_2CH_2CH_2O$—. A main chain backbone of the polyoxyalkylene-based polymer may consist of only one type of repeating unit or may consist of two or more types of repeating units. Particularly, a polymer having —$CH_2CH(CH_3)O$— as a primary repeating unit is preferable in view of availability and operational efficiency. The main chain of the polymer may include a repeating unit other than an oxyalkylene group. In this case, a total content of oxyalkylene units in the polymer is preferably 80 weight % or more, particularly preferably, 90 weight % or more, with respect to (100 weight %) of a total monomer component constituting the polymer.

The polyoxyalkylene-based polymer may be a straight-chain polymer or a branched polymer, or may be a mixture thereof. Preferably, in order to obtain, adequate pressure-sensitive adhesion, it contains 50 weight % or more of straight-chain polymer.

On the other hand, the acryl-based pressure-sensitive adhesive contains an acryl-based polymer as a base polymer. This acryl-based polymer comprises an acryl-based monomer as an essential monomer component. The acryl-based polymer may be a homopolymer of acryl-based monomers, or may be a copolymer of a plurality of types of acryl-based monomers, or may be a copolymer of an acryl-based monomer and a monomer other than an acryl-based monomer.

As the acrylic monomer, an alkyl(meth)acrylate ester containing a straight- or branched-chain alkyl group or an alkoxyalkyl(meth)acrylate ester are preferably. As used here, the term "(meth)acryl" means "acryl" and/or "methacryl.". This applies to other similar terms.

As the acrylic monomer, only the straight- or branched-chain alkyl group-containing alkyl(meth)acrylate ester may be used. Alternatively, only the alkoxyalkyl(meth)acrylate ester may be used. Alternatively, the straight- or branched-chain alkyl group-containing alkyl(meth)acrylate ester and the alkoxyalkyl(meth)acrylate ester may be used in combination. In the case where the straight- or branched-chain alkyl group-containing alkyl(meth)acrylate ester and the alkoxyalkyl(meth)acrylate ester are used in combination, as the acryl-based monomer, a ratio between them is not particularly limited.

In the pressure-sensitive adhesive for use in the present invention, in view of increasing a dielectric constant while obtaining a desired adhesive force to glass, the alkoxyalkyl (meth)acrylate ester is preferably used as the acrylic monomer.

The straight- or branched-chain alkyl group-containing alkyl(meth)acrylate ester is not particularly limited, and examples thereof include alkyl(meth)acrylate esters containing a straight- or branched-chain alkyl group of 1 to 20 carbon atoms, such as methyl(meth)acrylate, ethyl(meth)acrylate, propyl(meth)acrylate, isopropyl(meth)acrylate, butyl(meth)acrylate, isobutyl(meth)acrylate, s-butyl(meth)acrylate, t-butyl(meth)acrylate, pentyl(meth)acrylate, isopentyl(meth)acrylate, hexyl(meth)acrylate, heptyl(meth)acrylate, octyl(meth)acrylate, 2-ethylhexyl(meth)acrylate, isooctyl(meth)acrylate, nonyl(meth)acrylate, isononyl(meth)acrylate, decyl(meth)acrylate, isodecyl(meth)acrylate, undecyl(meth)acrylate, dodecyl(meth)acrylate, tridecyl(meth)acrylate, tetradecyl(meth)acrylate, pentadecyl(meth)acrylate, hexadecyl(meth)acrylate, heptadecyl(meth)acrylate, octadecyl(meth)acrylate, nonadecyl(meth)acrylate, and eicosyl(meth)acrylate. Among the straight- or branched-chain alkyl group-containing alkyl(meth)acrylate esters, an alkyl(meth)acrylate ester containing a straight- or branched-chain alkyl group of 1 to 14 carbon atoms is preferable, and an alkyl(meth)acrylate ester containing a straight- or branched-chain alkyl group of 1 to 10 carbon atoms is more preferable. The straight- or branched-chain alkyl group-containing alkyl(meth)acrylate esters may be used independently or in the form of a combination of two or more thereof.

The alkoxyalkyl meth)acrylate ester is not particularly limited, and examples thereof include 2-methoxyethyl (meth)acrylate, 2-ethoxyethyl(meth)acrylate, methoxytriethyleneglycol(meth)acrylate, 3-methoxypropyl(meth)acrylate, 3-ethoxypropyl(meth)acrylate, 4-methoxybutyl(meth)acrylate, and 4-ethoxybutyl(meth)acrylate. Among the alkoxyalkyl(meth)acrylate esters, an alkoxyalkyl acrylate ester is preferable, and 2-methoxyethyl acrylate (2MEA) is more preferable.

In the above acryl-based polymer, a ratio of a total amount of the straight- or branched-chain alkyl group-containing alkyl(meth)acrylate ester and the alkoxyalkyl(meth)acrylate ester to (100 weight % of) a total monomer component constituting the acryl-based polymer is not particularly limited. However, in view of facilitating adjustment of adhesiveness and dielectric constant of a pressure-sensitive adhesive sheet, the ratio is preferably equal to or greater than 70 weight % (e.g., in the range of 70 to 100 weight %), more preferably, equal to or greater than 80 weight % (e.g., in the range of 80 to 100 weight %), with respect to (100 weight % of) the total monomer component constituting the acryl-based polymer.

In the case where the alkoxyalkyl(meth)acrylate ester is used as the acryl-based monomer, a ratio of the alkoxyalkyl (meth)acrylate ester to (100 weight % of) the total monomer component constituting the acryl-based polymer, in view of ease of obtaining adequate adhesiveness to an optical element and a high dielectric constant, the ratio is preferably equal to or greater than at least 40 weight % (e.g., in the range of 70 to 100 weight %), more preferably, equal to or greater than 50 weight %.

(4-2-1-2. Low-Dielectric Pressure-Sensitive Adhesive Layer)

Preferably, the pressure-sensitive adhesive layer is an acryl-based pressure-sensitive adhesive layer comprising an acryl-based polymer formed from a monomer component which is one or more selected from the group consisting of an alkyl acrylate ester containing a straight- or branched-chain alkyl group of 6 to 10 carbon atoms; an alkyl methacrylate ester containing a straight- or branched-chain alkyl group of 1 to 10 carbon atoms; a (meth)acrylate ester containing an alicyclic hydrocarbon group; and a nitrogen-containing monomer, wherein a ratio of the monomer component is equal to or greater than 60 weight %, with respect to an amount (100 weight %) of a total monomer component constituting the acryl-based polymer.

Preferably, in the pressure-sensitive adhesive for use in the present invention, the alicyclic hydrocarbon group-containing (meth)acrylate ester is at least monomer selected from the group consisting of cyclohexyl(meth)acrylate and isobonyl(meth)acrylate.

Preferably, in the pressure-sensitive adhesive for use in the present invention, the nitrogen-containing monomer is at least monomer selected from the group consisting of (meth) acryloylmorpholine and N-vinylpyrrolidone.

(4-2-1-3. General Information regarding Pressure-Sensitive Adhesive Layers)

In view of transparency, processability, durability, etc, as a base polymer, base polymers in heretofore-known acryl-based and polyether-based pressure-sensitive adhesives may be suitably used, and, in particular, a base polymer in a conventional acryl-based pressure-sensitive adhesive may be suitably used.

The base polymer of the polyether-based pressure-sensitive adhesive is not particularly limited, and examples thereof include polyoxyalkylene-based polymers. Among the polyoxyalkylene-based polymers, a type whose main chain has a repeating unit represented by the following general formula (2) is preferable.

$$-R^1-O-$$ General formula (2)

(wherein $R^1$ represents an alkylene group.)

$R^1$ is preferably a straight-chain or branched alkylene group of 1 to 14 carbon atoms, more preferably, a straight-chain or branched alkylene group of 2 to 4 carbon atoms.

Specific examples of the repeating unit represented by the general formula (2) include —$CH_2O$—, —$CH_2CH_2O$—, —$CH_2CH(CH_3)O$—, —$CH_2CH(C_2H_5)O$—, —$CH_2C(CH_3)_2O$—, and —$CH_2Cl_2CH_2CH_2O$—. A main chain backbone of the polyoxyalkylene-based polymer may consist of only one type of repeating unit or may consist of two or more types of repeating units. Particularly, a polymer having —$CH_2CH(CH_3)O$— as a primary repeating unit is preferable in view of availability and operational efficiency. The main chain of the polymer may include a repeating unit other than an oxyalkylene group. In this case, a total content of oxyalkylene units in the polymer is preferably 80 weight % or more, particularly preferably, 90 weight % or more.

The polyoxyalkylene-based polymer may be a straight-chain polymer or a branched polymer, or may be a mixture thereof. Preferably, in order to obtain adequate pressure-sensitive adhesion, it contains 50 weight % or more of straight-chain polymer.

An acryl-based polymer as a base polymer of the acryl-based pressure-sensitive adhesive is formed using an acryl-based monomer as an essential monomer component. In the present invention, as the acryl-base monomer, it is possible to use an alkyl(meth)acrylate ester containing a straight- or branched-chain alkyl group (hereinafter referred to occasionally and simply as "alkyl(meth)acrylate ester"), and an alkoxy(meth)acrylate ester. As used here, the term "(meth)acryl" means "acryl" and/or "methacryl" and the similarly for the others. This applies to other similar terms.

In the present invention, in the case where the straight-chain or branched alkyl group-containing alkyl(meth)acrylate ester is used as the acryl-based monomer, the straight-chain or branched alkyl group-containing alkyl(meth)acrylate ester may be used alone, or the straight-chain or branched alkyl group-containing alkyl(meth)acrylate ester and the alkoxy(meth)acrylate ester may be used in combination. In the case where the straight-chain or branched alkyl group-containing alkyl(meth)acrylate ester and the alkoxy(meth)acrylate ester are used in combination, a ratio therebetween is not particularly limited, but the ratio of the straight-chain or branched alkyl group-containing alkyl(meth)acrylate ester may be greater than, or less than, or equal to, that of the alkoxy(meth)acrylate ester The straight- or branched-chain alkyl group-containing alkyl(meth)acrylate ester is not particularly limited, and examples thereof include alkyl(meth)acrylate esters containing an alkyl group of 1 to 20 carbon atoms, such as methyl(meth)acrylate, ethyl(meth)acrylate, propyl(meth)acrylate, isopropyl(meth)acrylate, butyl(meth)acrylate, isobutyl(meth)acrylate, s-butyl(meth)acrylate, t-butyl(meth)acrylate, pentyl(meth)acrylate, isopentyl(meth)acrylate, hexyl(meth)acrylate, heptyl(meth)acrylate, octyl(meth)acrylate, 2-ethylhexyl(meth)acrylate, isooctyl(meth)acrylate, nonyl(meth)acrylate, isononyl(meth)acrylate, decyl(meth)acrylate, isodecyl(meth)acrylate, undecyl(meth)acrylate, dodecyl(meth)acrylate, tridecyl(meth)acrylate, tetradecyl(meth)acrylate, pentadecyl(meth)acrylate, hexadecyl(meth)acrylate, heptadecyl(meth)acrylate, octadecyl(meth)acrylate, nonadecyl(meth)acrylate, and eicosyl(meth)acrylate. The above alkyl(meth)acrylate esters may be used independently or in the form of a combination of two or more thereof. Among them, an alkyl(meth)acrylate ester containing an alkyl group of 1 to 14 carbon atoms is preferable, and an alkyl(meth)acrylate ester containing an alkyl group of 1 to 10 carbon atoms is more preferable.

The alkoxyalkyl(meth)acrylate ester is not particularly limited, and examples thereof include 2-methoxyethyl(meth)acrylate, 2-ethoxyethyl(meth)acrylate, methoxytriethyleneglycol(meth)acrylate, 3-methoxypropyl(meth)acrylate, 3-ethoxypropyl(meth)acrylate, 4-methoxybutyl(meth)acrylate, and 4-ethoxybutyl(meth)acrylate. Among them, an alkoxyalkyl acrylate ester is preferable, and 2-methoxyethyl acrylate (2MEA) is more preferable. The above alkoxyalkyl(meth)acrylate esters may be used independently or in the form of a combination of two or more thereof.

In view of adhesion of the pressure-sensitive adhesive layer, a content of the acryl-based polymer is preferably equal to or greater than 70 weight % (e.g., in the range of 70 to 100 weight %), more preferably, equal to or greater than 80 weight % (e.g., 80 to 100 weight %), and further preferably, equal to or greater than 90 weight % (e.g., 90 to 100 weight %), with respect to an amount of a total monomer component constituting the acryl-based polymer.

In addition to the acryl-based monomers (the straight- or branched-chain alkyl group-containing alkyl(meth)acrylate ester and the alkoxyalkyl(meth)acrylate ester), the monomer component constituting the acryl-based polymer as a base polymer may further comprise, as a copolymerizable monomer, a polar group-containing monomer, a multifunctional monomer, and other copolymerizable monomers.

Regarding the polar group-containing monomer, examples thereof include: carboxyl group-containing monomers, such as (meth)acrylic acid, itaconic acid, maleic acid, fumaric acid, crotonic acid, and isocrotonic acid, and anhydrides thereof (e.g., maleic anhydride); hydroxyl group-containing monomers, such as vinyl alcohol, aryl alcohol, and hydroxyalkyl(meth)acrylate, e.g., 2-hydroxyethyl(meth)acrylate, 3-hydroxypropyl(meth)acrylate, 4-hydroxybutyl(meth)acrylate or 6-hydroxyhexyl(meth)acrylate; amide group-containing monomers, such as (meth)acrylamide, N,N-dimethyl(meth)acrylamide, N-methylol(meth)acrylamide, N-methoxymethyl(meth)acrylamide, N-butoxymethyl(meth)acrylamide and N-hydroxyethyl acrylamide; amino group-containing monomers, such as aminoethyl(meth)acrylate, dimethylaminoethyl(meth)acrylate and t-butyl aminoethyl(meth)acrylate; glycydyl group-containing monomers, such as glycidyl(meth)acrylate and methylglycidyl(meth)acrylate; cyano group-containing monomers, such as acrylonitrile and methacrylonitrile; heterocyclic ring-containing vinyl monomers, such as N-vinyl-2-pyrrolidone, (meth)acryloyl morpholine, N-vinyl-pyridine, N-vinyl piperine, N-vinyl pyrimidine, N-vinyl piperazine, N-vinyl pyrrole, N-vinyl imidazole, and N-vinyl oxazole; sulfonate group-containing monomers, such as sodium vinyl sulfonate; phosphate group-containing monomers, such as 2-hydroxyethyl acryloyl phosphate; imide group-containing monomers, such as cyclohexyl maleimide and isopropyl maleimide; and isocyanate group-containing monomers, such as 2-methacryloyloxyethyl isocyanate. The above polar group-containing monomers may be used independently or in the form of a combination of two or more thereof.

Among the above polar group-containing monomers, carboxyl group-containing monomers and anhydrides thereof; hydroxyl group-containing monomers, amino group-containing monomers, amide group-containing monomers and heterocyclic ring-containing vinyl monomers are preferable, and acrylic acid (AA), methacrylic acid (MAA), 2-hydroxyethyl acrylate (2HEA), 6-hydroxyhexyl acrylate (HHA), 4-hydroxybutyl acrylate (4HBA), N-vinyl-2-pyrrolidone (NVP), and N-hydroxyethyl acrylamide (HEAA) are particularly preferable.

A content of the polar group-containing monomer is preferably equal to or less than 40 weight % (e.g., in the range of 0.01 to 40 weight %), more preferably, in the range of 1 to 30 weight %, with respect to the amount of the total monomer component constituting the acryl-based polymer. If the content is greater than 40 weight %, a cohesion force of the pressure-sensitive adhesive layer is excessively increased, which is likely to cause deterioration in stress relaxation property; for example. If the content is less than 0.01 weight %, the cohesion force of the pressure-sensitive adhesive layer is lowered, thereby causing deterioration in pressure-sensitive adhesion performance.

Regarding the multifunctional monomers, examples thereof include hexanediol di(meth)acrylate, butanediol di(meth)acrylate, (poly)ethylene glycol di(meth)acrylate, (poly)propylene glycol di(meth)acrylate, neopentyl glycol di(meth)acrylate, pentaerythritol di(meth)acrylate, pentaerythritol tri(meth)acrylate, dipentaerythritol hexa(meth)acrylate, trimethylolpropane tri(meth)acrylate, tetramethylolmethane tri(meth)acrylate, allyl(meth)acrylate, vinyl (meth)acrylate, divinyl benzene, epoxy acrylate, polyester acrylate and urethane acrylate. These multifunctional monomers may be used independently or in the form of a combination of two or more thereof.

While a content of the multifunctional monomer is not particularly limited, it is preferably equal to or less than 5 weight % (e.g., in the range of 0.01 to 5 weight %), more preferably, equal to or less than 1 weight % (e.g., in the range of 0.01 to 1 weight %), with respect to the amount of the total monomer component constituting the acryl-based polymer. If the content of the multifunctional monomer is greater than 5 weight %, a cohesion force of the pressure-sensitive adhesive layer is excessively increased, which is likely to cause deterioration in stress relaxation property.

Regarding the copolymerizable monomers other than the polar group-containing monomer and the multifunctional monomer, (other copolymerizable monomers), examples thereof include: (meth)acrylic acid esters other than the aforementioned alkyl(meth)acrylate esters, polar group-containing monomers and multifunctional monomers, such as a (meth)acrylic acid ester containing an alicyclic hydrocarbon group, e.g., cyclopentyl(meth)acrylate, cyclohexyl(meth)acrylate or isobornyl(meth)acrylate, and a (meth)acryl-based acid ester containing an aromatic hydrocarbon group, e.g., phenyl(meth)acrylate; vinyl esters, such as vinyl acetate and vinyl propionate; aromatic vinyl compounds, such as styrene and vinyl toluene; olefins or dienes, such as ethylene, butadiene, isoprene, and isobutylene; vinyl ethers, such as vinyl alkyl ether; and vinyl chlorides.

The acryl-based polymer as a base polymer can be prepared by polymerizing the above monomer component by a heretofore-known or commonly-used polymerization process. Examples of the acryl-based polymer polymerization process include a solution polymerization process, an emulsion polymerization process, a bulk polymerization process and a polymerization process based on irradiation with an active energy beam (active energy beam polymerization process or a photopolymerization process). Evaluating them in terms of transparency, water resistance, cost, etc, the solution polymerization process and the active energy beam polymerization process are preferable. Particularly, in the case where the pressure-sensitive adhesive layer is firmed to have a relatively large thickness, the active energy beam polymerization process is preferable, wherein an ultraviolet polymerization process based on irradiation with an ultraviolet beam is particularly preferable.

Examples of the active energy beam to be emitted during the active energy beam polymerization (photopolymerization) process include an ultraviolet beam, or an ionizing radiation, such as α beam, β beam γ beam, neutron beam, and electron beam. Among them, the ultraviolet beam is preferable. Irradiation energy, irradiation time and irradiation method of the active energy beam are not particularly limited, as long as they allow the photopolymerization initiator to be activated to induce a reaction of the monomer component.

In the solution polymerization, various conventional solvents may be used. Examples of the solvents include organic solvents, such as esters, e.g., ethyl acetate and n-butyl acetate; aromatic hydrocarbons, e.g., toluene and benzene; aliphatic hydrocarbons, e.g., n-hexane and n-heptane; alicyclic hydrocarbons, e.g., cyclohexane and methylcyclohexane; ketones, e.g., methyl ethyl ketone and methyl isobutyl ketone. These solvents may be used independently or in the form of a combination of two or more thereof.

In preparation of the acryl-based polymer, a polymerization initiator, such as a thermal polymerization initiator or a photopolymerization initiator (photo initiator), may be used, depending on a type of polymerization reaction. These polymerization initiators may be used independently or in the form of a combination of two or more thereof.

The photopolymerization initiator is not particularly limited, and examples thereof include a benzoin ether-based photopolymerization initiator, an acetophenon-based photopolymerization initiator, an α-ketol-based photopolymerization initiator, an aromatic sulfonyl chloride-based photopolymerization initiator, a photoactive oxime-based photopolymerization initiator, a benzoin-based photopolymerization initiator, a benzyl-based photopolymerization initiator, a benzophenone-based photopolymerization initiator, a ketal-based photopolymerization initiator and a thioxanthene-based photopolymerization initiator.

Examples of the benzoin ether-based photopolymerization initiator include benzoin methyl ether, benzoin ethyl ether, benzoin propyl ether, benzoin isopropyl ether, benzoin isobutyl ether, 2,2-dimethoxy-1,2-diphenylethane-1-one, and anisole methyl ether. Examples of the acetophenon-based photopolymerization initiator include 2,2-di ethoxyacetophenone, 2,2-dimethoxy-2-phenylacetophenone, 1-hydroxycyclohexylphenylketone, 4-phenoxydichloroacetophenone and 4-(t-butyl)dichloroacetophenone. Examples of the α-ketol based photopolymerization initiator include 2-methyl-2-hydroxypropiophenone and 1-[4-(2-hydroxyethyl)phenyl]-2-methylpropane-1-one. Examples of the aromatic sulfonyl chloride-based photopolymerization initiator include 2-naphthalenesulfonyl chloride. Examples of the photoactive oxime-based photopolymerization initiator include 1-phenyl-1,1-propandion-2-(o-ethoxycarbonyl)-oxime. Examples of the benzoin-based photopolymerization initiator include benzoin. Examples of the benzyl-based photopolymerization initiator include benzyl. Examples of the benzophenone-based photopolymerization initiator include benzophenone, benzoyl benzoate, 3,3'-dimethyl-4-methoxybenzophenone, polyvinyl benzophenone and α-hydroxycyclohexyl phenylketone. Examples of the ketal-based photopolymerization initiator include benzyl dimethyl ketal. Examples of the thioxanthone-based photopolymerization initiator include thioxanthone, 2-chlorothioxanthone, 2-methyl thioxanthone, 2,4-dimethyl thioxanthone, isopropyl thioxanthone, 2,4-diisopropyl thioxanthone, and dodecyl thioxanthone.

An amount of the photopolymerization initiator to be used is not particularly limited. For example, it is preferably set in the range of 0.005 to 1 weight part, with respect to 100 weight parts of a total monomer component constituting the acryl-based polymer. The above photopolymerization initiators may be used independently or in the form of a combination of two or more thereof.

Examples of the thermal polymerization initiator include: azo-based polymerization initiators (e.g., 2,2'-azobisisobutyronitrile, 2,2'-azobis-2-methylbutyronitrile, dimethyl 2,2'-azobis(2-methylpropionate), 4,4'-azobis-4-cyanovaleric acid, azobisisovaleronitrile, 2,2'-azobis(2-amidinopropan) dihydrochloride, 2,2'-azobis[2-(5-methyl-2-imidazolin-2-yl) propane]dihydrochloride, 2,2'-azobis(2-methylpropionamidine)disulfate and 2,2'-azobis(N,N'-dimethyleneisobutylamidine)dihydrochloride); peroxide-based polymerization initiators (e.g., dibenzoyl peroxide and t-butyl permaleate); and redox-based polymerization initiators. An amount of the thermal polymerization initiator to be used is not particularly limited, as long as it falls within a heretofore-known allowable range for the thermal polymerization initiator.

For the pressure-sensitive adhesive, a crosslinking agent may be used. When the crosslinking agent is used, the acryl-based polymer is crosslinked, thereby providing a higher cohesion force of the pressure-sensitive adhesive layer. The crosslinking agent is not particularly limited, but a wide range of heretofore-known crosslinking agents may be used. In particular, an isocyanate-based crosslinking agent and an epoxy-based crosslinking agent are suitably used. The above crosslinking agents may be used independently or in the form of a combination of two or more thereof.

Regarding the isocyanate-based crosslinking agent, examples thereof include: lower aliphatic polyisocyanates, such as 1,2-ethylene diisocyanate, 1,4-butylene diisocyanate, and 1,6-hexamethylene diisocyanate; alicyclic polyisocyanates, such as cyclopentylene diisocyanate, cyclohexylene diisocyanate, isophorone diisocyanate, hydrogenated tolylene diisocyanate and hydrogenated xylene diisocyanate; and aromatic polyisocyanates, such as 2,4-tolylene diisocyanate, 2,6-tolylene diisocyanate, 4,4'-diphenylmethane diisocyanate and xylene diisocyanate. In addition to the above, an adduct of trimethylolpropane/tolylene diisocyanate (trade name "CORONATE L", manufactured by Nippon Polyurethane Industry Co., Ltd.); and an adduct of trimethylolpropane/hexamethylene diisocyanate (trade name "CORONATE HL", manufactured by Nippon Polyurethane Industry Co., Ltd.) may also be used.

Regarding the epoxy-based crosslinking agents, examples thereof include: N,N,N',N'-tetraglycidyl-m-xylenediamine; diglycidylaniline; 1,3-bis(N,N-diglycidylaminomethyl)cyclohexane; 1,6-hexandioldiglycidyl ether; neopentyl, glycol diglycidyl ether; ethylene glycol diglycidyl ether; propylene glycol diglycidyl ether; polyethylene glycol diglycidyl ether; polypropylene glycol diglycidyl ether; sorbitol polyglycidyl ether; glycerol polyglycidyl ether; pentaerythritol polyglycidyl ether; polyglycerol polyglycidyl ether; sorbitan polyglycidyl ether; trimethylol propane polyglycidyl ether; adipic acid diglycidyl ester; o-plithalic acid diglycidyl ester; triglycidyl-tris(2-hydroxyethyl)isocyanurate; resorsin diglycidyl ether; bisphenol-S-diglycidylether; and an epoxy-based resin containing two or more epoxy groups in a molecule thereof. As for a commercially available product, "TETRAD C" (trade name; manufactured by Mitsubishi Gas Chemical Company Inc.) may be used, for example.

An amount of the crosslinking agent to be used is not particularly limited. For example, generally, it is set preferably in the range of 0.001 to 20 weight parts, more preferably, in the range of 0.01 to 10 weight parts, with respect to 100 weight parts of the acryl-based polymer. Particularly in the case where the isocyanate-based crosslinking agent is used, an amount of the isocyanate-based crosslinking agent to be used is preferably in the range of 0.01 to 20 weight parts, preferably, in the range of 0.01 to 3 weight parts, with respect to 100 weight parts of the acryl-based polymer. On the other hand, in the case where the epoxy-based crosslinking agent is used, an amount of the epoxy-based crosslinking agent to be used is preferably in the range of 0.001 to 5 weight parts, more preferably, in the range of 0.01 to 5 weight parts, with respect to 100 weight parts of the acryl-based polymer.

For the pressure-sensitive adhesive layer, it is possible to use a heretofore-known additive, such as a crosslinking promoter, a tackifier (e.g., rosin derivative resin, polyterpene resin, petroleum resin, or oil-soluble phenolic resin), an anti-aging agent, a filler, a coloring agent (e.g., pigment and dye), an ultraviolet absorber, an antioxidant, a chain transfer agent, a plasticizer, a softener, a surfactant, or an antistatic agent, within a range causing no risk of spoiling advantageous effects of the present invention, on an as-needed basis.

In the case where the pressure-sensitive adhesive is used as the transparent inter-layer resin in the present invention, as a method for forming the pressure-sensitive adhesive layer, it is possible to use various heretofore-known or commonly-used pressure-sensitive adhesive layer forming methods. While a suitable one of the methods varies depending on the type of base polymer polarization process, etc., and therefore it is not particularly limited, examples thereof include the following methods.

(1) A pressure-sensitive adhesive layer is formed by: applying (coating), on a substrate or a release liner, a composition Which contains a mixture of a monomer component (monomer mixture) forming a base polymer (e.g., an acryl-based polymer) or a partially-polymerized product of the monomer mixture, and optionally an additive such as a photopolymerization initiator; and irradiating the composition with an active energy beam.

(2.) A pressure-sensitive adhesive layer is formed by: applying (coating), on a substrate or a release liner, a composition containing a base polymer, a solvent, and optionally an additive (pressure-sensitive adhesive composition or solvent type pressure-sensitive adhesive composition) (solution); and drying and/or curing the composition.

When needed, each of the methods (1) and (2) may be provided with a heating and drying step. As used here, the term "monomer mixture" means a mixture consisting of a monomer component constituting the base polymer. Further, the term "partially-polymerized product" means a composition in which one or more elements of the monomer mixture are partially polymerized. Further, the term "pressure-sensitive adhesive composition" includes a meaning of "a composition for forming the pressure-sensitive adhesive layer".

For the application (coating) in the pressure-sensitive adhesive layer forming method, it is possible to use various heretofore-known coating processes, and use a commonly-used coater, such as a gravure roll coater, a reverse roll coater, a kiss roll coater, a dip roll coater, a bar coater, a knife coater, a spray coater, a comma coater, or a direct coater.

A thickness of the transparent inter-layer resin to be employed in the present invention may be determined depending on various required properties.

Regarding the first transparent inter-layer resin, in view of enhancing sensitivity of the capacitive touch panel, a smaller thickness is better, because this leads to an increase in $C_{finger}$ which is a capacitance between a receiving-side ITO electrode and a transmitting-side ITO electrode after finger touch onto the touch panel. For example, the thickness is preferably set in the range of 5 to 500 μm. Further, in the case where the first transparent inter-layer resin is a pressure-sensitive adhesive, a step is formed due to a decoration (for making wirings of the touch panel invisible) printed on an edge region of the window. A thickness of the pressure-sensitive adhesive suited to absorb the step is in the range of about 50 to 300 μm.

Regarding the second transparent inter-layer resin, in view of enhancing the sensitivity of the capacitive touch panel, a larger thickness is better, because this leads to a decrease in $C_{ITO}$ which is a capacitance between the receiving-side ITO electrode and the transmitting-side ITO electrode before finger touch onto the touch panel. For example, the thickness may be set preferably in the range of 5 to 500 μm, more preferably, in the range of 10 to 200 μm. Further, in the case where the second transparent inter-layer resin is a pressure-sensitive adhesive, and the transparent film in the present invention is PET, in view of preventing a problem that the pressure-sensitive adhesive gets cloudy, or preventing a situation where an oligomer component is produced from a PET material in a heating test, the thickness is increased. In this way, the thickness may be determined so as to additionally satisfy other requirements.

In the transparent inter-layer resin in the present invention, while a total light transmittance in a visible light wavelength range (in accordance with JIS K 7361) is not particularly limited, it is preferably equal to or greater than 90% (e.g., in the range of 90 to 99.9%), more preferably, equal to or greater than 91% (e.g., in the range of 91 to 99.9%). Further, while a haze (in accordance with JIS K 7136) of the transparent inter-layer resin is not limited, it is preferably equal to or less than 3.0% (e.g., in the range of 0.1 to 3.0%), more preferably, equal to or less than 2.0% (e.g., in the range of 0.1 to 2.0%). This is because, in view of visibility of the capacitive touch panel of the present invention, it is preferable that the transparent inter-layer resin has high transparency. The total light transmittance and the haze can be measured using, for example, a haze meter (trade name "HM-150", manufactured by Murakami Color Research Laboratory Co., Ltd.).

5. Production of Capacitive Touch Panel

FIG. 1 is a schematic diagram illustrating a cross-section of a capacitive touch panel according to one embodiment of the present invention.

In the case where a liquid resin, such as an ultraviolet-curable optical resin adhesive composition, is used for the transparent inter-layer resin for use in the present invention, the capacitive touch panel according to the embodiment of the present invention can be produced in the following manner.

An interspace between a window 1 as a cover glass, and one surface of a first transparent film 4 on which a first transparent conductive electrode pattern 3 is formed is filled with a first transparent inter-layer resin 2.

Then, an interspace between the other surface of the first transparent film 4 on a side opposite to the first transparent conductive electrode pattern 3, and one surface of a second transparent film 7 on which a second transparent conductive electrode pattern 6 is formed is filled with a second transparent inter-layer resin 5 having a dielectric constant less than that of the first transparent inter-layer resin 2.

Then, the first transparent inter-layer resin 2 and the second transparent r-layer resin 5 are cured, for example, by means of irradiation with ultraviolet light, to form a first transparent inter-layer resin 2 and a second transparent inter-layer resin 5, respectively.

In the case where an inter-layer pressure-sensitive adhesive is used as the transparent inter-layer resin for use in the present invention, the capacitive touch panel according to the embodiment of the present invention can be produced in the following manner.

Referring to FIG. 1 again, the window 1 as a cover glass, and one surface of the first transparent film 4 on which the first transparent conductive electrode pattern 3 is formed, are bonded together by using a high-dielectric pressure-sensitive adhesive sheet as the first transparent inter-layer resin 2.

Then, the other surface of the first transparent film 4 on the side opposite to the first transparent conductive electrode pattern 3, and one surface of the second transparent film 7 on which the second transparent conductive electrode pattern 6 is Rained, are bonded together by using a low-dielectric pressure-sensitive adhesive sheet as the second transparent inter-layer resin 5.

The present invention will be described in more detail by demonstrating examples. It is to be understood that the present invention is not limited to the following examples.

EXAMPLES

6. Examples Using Liquid Inter-Layer Filling Resin 6-1. Inventive Example 1

6-1-1. Liquid Inter-Layer Filling Resin for First Transparent Inter-Layer Resin 40 g (0.0143 mol as an OH group) of a liquid acrylic polymer serving as a hydroxyl group-containing vinyl polymer and having a viscosity of 14,000 mPa·s, a weight-average molecular weight of 11,000 and a hydroxyl equivalent (OHV) of 20 mgKOH/g, 0.60 g (0.0036 mol) of hexamethylene diisocyanate, and 0.28 g (0.0018 mol) of 2-isocyanate ethylmethacrylate were put into a reaction container, and held at 50° C. in a hot-water bath under a nitrogen stream. Subsequently, 0.0018 g (0.2 weight % with respect to a total amount of 2-isocyanate ethylmethacrylate and hexamethylene diiocyanate) of dibutyltin laurate (catalyst) was added thereto, and a resulting mixture was held for 8 hours while producing a reaction therein. Then, based on an infrared absorption spectrum (FT-IR manufactured by Thermo Electron Co., Ltd., type FT-IR 200), disappearance of a band at 2,260 $cm^{-1}$ in a resulting reaction product (characteristic absorption band derived from an isocyanate group) was confirmed. This shows that a urethane acrylate-based polymer (having a weight-average molecular weight of 100,000) containing a methacryloyl group and a hydroxyl group on side chains thereof was produced.

Then, 7.0 g of the above urethane acrylate-based polymer containing a methacryloyl group and a hydroxyl group on side chains thereof, 0.3 g of 3-acryloxypropyl trimethoxysilane serving as a diluent, 0.21 g of 1-hydroxy-cyclohexyl-phenyl-ketone serving as a photoradical polymerization initiator, and 0.09 g of bis(2,4,6-trimethylbenzoyl)-phenylphosphine oxide, were preliminarily prepared, and mixed together using a planetary stirring/defoaming apparatus under a light-blocked condition to prepare an ultraviolet-curable optical resin adhesive composition. A viscosity thereof measured using an E-type rotational viscometer at 25° C. was 3,000 mPa·s.

6-1-2. Liquid Inter-Layer Filling Resin for Second Transparent Inter-Layer Resin 10.0 g of the side-chain methacryloyl group and hydroxyl group-containing urethane acrylate-based polymer, 0.3 g of 3-acryloxypropyl trimethoxysilane serving as a diluent, 0.21 g of 1-hydroxy-cyclohexyl-phenyl-ketone serving as a photoradical polymerization initiator, and 0.09 g of bis(2,4,6-trimethylbenzoyl)-phenylphosphine oxide, were preliminarily prepared. Except that, an intended ultraviolet-curable optical resin adhesive composition was prepared in the same manner as above. A viscosity thereof measured using an E-type rotational viscometer at 25° C. was 60,000 mPa·s.

6-1-3. Measurement of Dielectric Constant of Inter-Layer Resin

A silicone rubber cast mold was preliminarily prepared, each of the ultraviolet-curable optical resin adhesive compositions was cast into the cast mold and irradiated with ultraviolet light under a condition that a cumulative light amount was set to 6000 mJ/cm$^2$, to prepare a circular plate having a diameter of 50 mm and a thickness of 2 mm. Then, after attaching thereto a main electrode having a diameter of 30 mm, a back electrode having a diameter of 50 mm and a guard electrode, a dielectric constant of each of the first and second transparent inter-layer resins was measured at room temperature (25° C.) and at a frequency of 100 kHz, using an automatic dielectric loss measurement apparatus TR-1100 manufactured by Ando Electric Co., Ltd. A result of the measurement is presented in Table 1.

6-1-4. Assembling of Capacitive Touch Panel

An interspace (thickness: 100 μm, area: 0.03 cm$^2$) between a cover glass (thickness: 1000 μm, dielectric constant: 7.4) and one surface of a first transparent film (thickness: 200 μm, dielectric constant: 3.1) on which a transparent conductive electrode pattern (i.e., one surface of a receiving-side ITO electrode layer) is formed was filled with the ultraviolet-curable optical resin adhesive composition for the first transparent inter-layer resin, and an interspace (thickness: 50 μm) between the other surface of the first transparent film on a side opposite to the transparent conductive electrode pattern of the receiving-side ITO electrode layer, and one surface of a second transparent film on which a transparent conductive electrode pattern (i.e., one surface of a transmitting-side ITO electrode layer) is formed is filled with the ultraviolet-curable optical resin adhesive composition for the second transparent inter-layer resin. Then, the ultraviolet-curable optical resin adhesive compositions were cured by means of irradiation with ultraviolet light under a condition that a cumulative light amount was set to 6000 mJ/cm$^2$, to prepare a capacitive touch panel.

6-1-5. Measurement of Capacitance Change Rate

A capacitance change rate as an index of touch sensor sensitivity was measured as a ratio of $C_{finger}$, which is a capacitance between the receiving-side ITO electrode layer and the transmitting-side ITO electrode layer after finger touch onto the touch panel, to $C_{ITO}$ which is a capacitance between the receiving-side ITO electrode layer and the transmitting-side ITO electrode layer before the finger touch onto the touch panel, i.e., $\Delta C$ (%)=$C_{finger}/C_{ITO} \times 100$. A capacitance was measured using a LCR meter (4284A) manufactured by Agilent Technologies, Inc. The capacitance may be obtained by simulation based on calculation using Femtet manufactured by Murata Software Co., Ltd.

6-2. Inventive Example 2

6-2-1. Liquid Inter-Layer Filling Resin for First Transparent Inter-Layer Resin The liquid inter-layer filling resin between the receiving-side ITO electrode layer and the transmitting-side ITO electrode layer, prepared in Inventive Example 1, was used as a liquid, inter-layer filling resin between the cover glass and the receiving-side ITO electrode layer.

6-2-2. Liquid Inter-Layer Filling Resin for Second Transparent Inter-Layer Resin 8.0 g of the side-chain methacryloyl group and hydroxyl group-containing urethane acrylate-based polymer prepared in Inventive Example 1, 2.0 g of acrylic acid serving as a diluent, 0.3 g of 3-acryloxypropyltrimethoxysilane, 0.3 g of 3-acryloxypropyltrimethoxysilane, 0.21 g of 1-hydroxy-cyclohexyl-phenyl-ketone serving as a photoradical polymerization initiator, and 0.09 g of bis(2,4,6-trimethylbenzoyl)-phenylphosphine oxide, were preliminarily prepared, and used as a liquid inter-layer filling resin between the receiving-side ITO electrode layer and the transmitting-side ITO electrode layer. Except the above, an intended ultraviolet-curable optical resin adhesive composition was prepared in the same manner as that in Inventive Example 1. A viscosity thereof measured using an E-type rotational viscometer at 25° C. was 6,000 mPa·s.

The dielectric constant and the capacitance change rate were measured in the same manner as that in Inventive Example 1. A result of the measurement is presented in Table

6-3. Inventive Example 3

6-3-1. Liquid Inter-Layer Filling Resin for First Transparent Inter-Layer Resin 5.0 g of the side-chain methacryloyl group and hydroxyl group-containing urethane acrylate-based polymer prepared in Inventive Example 1, 5.0 g of 1H,1H,5H-octafluoropentyl acrylate serving as a diluent, 0.3 g of 3-acryloxypropyltrimethoxysilane, 0.21 g of 1-hydroxy-cyclohexyl-phenyl-ketone serving as a photoradical polymerization initiator, and 0.09 g of bis(2,4,6-trimethylbenzoyl)-phenylphosphine oxide, were preliminarily prepared, and mixed together using a planetary stirring/defoaming apparatus under a light-blocked condition to prepare an intended ultraviolet-curable optical resin adhesive composition. This composition was used as a liquid inter-layer filling resin between the cover glass and the receiving-side ITO electrode layer. A viscosity thereof measured using an E-type rotational viscometer at 25° C. was 500 mPa·s.

6-3-2. Liquid Inter-Layer Filling Resin for Second Transparent Inter-Layer Resin 8.0 g of the side-chain methacryloyl group and hydroxyl group-containing urethane acrylate-based polymer prepared in Inventive Example 1, 2.0 g of acrylic acid serving as a diluent, 0.3 g of 3-acryloxypropyltrimethoxysilane, 0.3 g of 3-acryloxypropyltrimethoxysilane, 0.21 g of 1-hydroxy-cyclohexyl-phenyl-ketone serving as a photoradical polymerization initiator, and 0.09 g of bis(2,4,6-trimethylbenzoyl)-phenylphosphine oxide, were preliminarily prepared. Except that, an intended ultraviolet-curable optical resin adhesive composition was prepared in the same manner as that in Inventive Example 1. A viscosity thereof measured using an E-type rotational viscometer at 25° C. was 6000 mPa·s.

The dielectric constant and the capacitance change rate were measured in the same manner as that in Inventive Example 1. A result of the measurement is presented in Table 1.

6-4. Comparative Example

Except that the liquid inter-layer filling resin used for the first transparent inter-layer resin in Inventive Example 1 was used as a liquid inter-layer filling resin between the receiving-side ITO electrode layer and the transmitting-side ITO electrode layer, a capacitive touch panel was prepared in the same manner as that in Inventive Example 1, and the capacitive change rate thereof was measured. A result of the measurement is presented in Table 1

TABLE 1

|  | Inventive Example 1 | Inventive Example 2 | Inventive Example 3 | Comparative Example 1 |
| --- | --- | --- | --- | --- |
| Dielectric constant of first transparent inter-layer resin | 5.8 | 5.8 | 5.3 | 5.8 |
| Dielectric constant of second transparent inter-layer resin | 3.7 | 3.7 | 3.7 | 5.8 |
| ΔC (%) | 21.7 | 21.7 | 21.2 | 20.7 |

From the results presented in Table 1, it is understood that, when the first inter-layer filling resin (inter-layer resin between the cover glass and the receiving-side ITO electrode layer) has a dielectric constant greater than that of the second inter-layer filling resin (inter-layer resin between the receiving-side ITO electrode layer and the transmitting-side ITO electrode layer), the capacitance change rate (ΔC) during finger touch is increased, and detection sensitivity (sensor sensitivity) is obviously enhanced.

7. Examples Using Inter-Layer Pressure-Sensitive Adhesive 7-1. Preparation

[7-1-1. Preparation of High-Dielectric Pressure-Sensitive Adhesive A]

55 weight parts of triethoxyethyl acrylate (MEA), 12 weight parts of ethylacrylate (EA), 15 weight parts of methyl methacrylate (MMA), 18 weight parts of 4-hydroxybutyl acrylate (4HBA), 0.3 weight parts of azobisisobutyronitrile, and 233.8 weight parts of ethyl acetate serving as a polymerization solvent were put into a separable flask, and stirred for 1 hour while introducing nitrogen gas thereinto. After removing oxygen inside a polymerization system in this manner, the system was heated up to 63° C. to produce a reaction therein for 10 hours, thereby obtaining an acryl-based polymer solution having a solid concentration of 30 weight %. An acryl-based polymer in the acryl-based polymer solution had a weight-average molecule weight of 1,100,000.

With respect to 100 weight parts (in solid matter equivalent) of the acryl-based polymer solution, an isocyanate-based crosslinking agent (manufactured by Nippon Polyurethane Industry Co., Ltd., trade name "CORONATE L") was mixed in an amount of 0.7 weight parts (in solid matter equivalent), and then a viscosity of a resulting mixture was adjusted using toluene to prepare a pressure-sensitive adhesive composition solution (solid concentration: 27 weight %, viscosity: 1.5 Pa's).

This solution was applied onto a release-treated surface of a release liner (a type comprising a polyethyleneterephthalate film whose one surface has been subjected to a release treatment, thickness of 38 μm, trade name "MRF38", manufactured by Mitsubishi Plastics Inc.) to form a coating layer. Then, the coating layer was heated and dried at 60° C. for 30 seconds and then heated and dried at 150° C. for 1 min. Then, a resulting dried layer was subjected to aging at 23° C. for 120 hours to prepare a pressure-sensitive adhesive sheet (substrateless type, a thickness of a pressure-sensitive adhesive layer: 50 μm and 100 μm).

The pressure-sensitive adhesive sheet obtained in the above manner was subjected to a measurement using a haze meter (trade name "HM-1.50" manufactured by Murakami Color Research Laboratory Co., Ltd.). As a result, a total light transmittance in a visible light wavelength range and a haze (in accordance with JIS K 7136) were, respectively, 92% and 0.5%.

Then, the pressure-sensitive adhesive sheet having the release liner attached on one surface of the pressure-sensitive adhesive layer is additionally provided with the same type of release liner on the other surface of the pressure-sensitive adhesive layer.

[7-1-2. Preparation of High-Dielectric Pressure-Sensitive Adhesive B]

Except that a monomer component was comprised of 59 weight parts of methoxyethyl acrylate (MEA), 40 weight parts of 2-ethylhexyl acrylate (2EHA), 1 weight part of 4-hydroxybutyl acrylate (4HBA), a pressure-sensitive adhesive sheet (substrateless type, a thickness of a pressure-sensitive adhesive layer: 50 μm and 100 μm) was prepared in the same manner as that in Inventive Example 1. The obtained pressure-sensitive adhesive sheet had a total light transmittance of 92% and a haze of 0.5%. Further, as with high-dielectric pressure-sensitive adhesive A, the pressure-sensitive adhesive sheet having the release liner attached on one surface of the pressure-sensitive adhesive layer is additionally provided with the same type of release liner on the other surface of the pressure-sensitive adhesive layer.

An acryl-based polymer in an acryl-based polymer solution herein had a weight-average molecule weight of 1,000,000.

[7-1-3. Preparation of Low-Dielectric Pressure-Sensitive Adhesive A]

46 weight parts of 2-ethylhexyl acrylate (2EHA), 15 weight parts of N-vinyl-2-pyrrolidone (NVP), 18 weight parts of methyl methacrylate (MMA), 21 weight parts of 2-hydroxyethyl acrylate (FLEA), 0.2 weight parts of 2,2'-azobisisobutyronitrile (AIBN) serving as a polymerization initiator, and 122 weight parts of ethyl acetate and 401 weight pars of toluene each serving as a polymerization solvent were preliminarily prepared as a monomer component. The monomer component was put into a separable flask, and stirred for 1 hour while introducing nitrogen gas thereinto. After removing oxygen inside a polymerization system in this manner, the system was heated up to 65° C. to produce a reaction therein for 10 hours. Then, ethyl acetate was added thereto to obtain an acryl-based polymer solution having a solid concentration of 36 weight %.

With respect to 100 weight parts of the acryl-based polymer solution, 0.3 weight parts of isocyanate-based crosslinking agent (manufactured by Mitsui Chemicals, Inc., trade name "TAKENATE D110N") was added as a crosslinking agent, and mixed to prepare a pressure-sensitive adhesive composition (solution).

Subsequently, the pressure-sensitive adhesive composition (solution) was applied onto a release-treated surface of a 50 μm-thick PET separator (manufactured by Teijin DuPont Films Japan Limited, trade name "Purex A43"), and heated and dried at 130° C. for 3 minutes to form a pressure-sensitive adhesive layer and thus obtain a pressure-sensitive adhesive sheet (a substrateless, two-sided pressure-sensitive adhesive sheet, a thickness of the pressure-sensitive adhesive layer: 50 μm and 100 μm). The obtained pressure-sensitive adhesive sheet had a total light transmittance of 92% and a haze of 0.4%.

[7-1-4. Preparation of Low-Dielectric Pressure-Sensitive Adhesive B]

46 weight parts of 2-ethylhexyl acrylate (2EHA), 15 weight parts of N-vinyl-2-pyrrolidone (NVP), 24 weight parts of methyl methacrylate (MMA), 15 weight parts of 2-hydroxyethyl acrylate (HEA), 0.2 weight parts of 2,2'-azobisisobutyronitrile (AIBN) serving as a polymerization initiator, and 163 weight parts of ethyl acetate serving as a polymerization solvent were preliminarily prepared as a monomer component. The monomer component was put into a separable flask, and stirred for 1 hour while introducing nitrogen gas thereinto. After removing oxygen inside a polymerization system in this manner, the system was heated up to 65° C. to produce a reaction therein for 7 hours. Then, ethyl acetate was added thereto to obtain an acryl-based polymer solution having a solid concentration of 36 weight %.

With respect to 100 weight parts of the acryl-based polymer solution, 0.3 weight parts of isocyanate-based crosslinking agent (manufactured by Mitsui Chemicals, Inc., trade name "TAKENATE D110N") was added as a crosslinking agent, and mixed to prepare a pressure-sensitive adhesive composition (solution).

Subsequently, in the same manner as that in the low-dielectric pressure-sensitive adhesive A, a pressure-sensitive adhesive sheet (a substrateless, two-sided pressure-sensitive adhesive sheet, a thickness of the pressure-sensitive adhesive layer: 50 μm and 100 μm) was obtained from the pressure-sensitive adhesive composition (solution). The obtained pressure-sensitive adhesive sheet had a total light transmittance of 92% and a haze of 0.4%.

7-2. Measurement of Dielectric Constant of Pressure-Sensitive Adhesive

The pressure-sensitive adhesive provided on the liners was machined and laminated into a size of 30 mm square and several ten to several hundred μm thickness. Then, a circular main electrode having a diameter of 13 mm, and a back electrode having a diameter of 25 mm were attached thereto in concentric relation to each other. Then, a dielectric constant of the pressure-sensitive adhesive was measured at room temperature (25° C.) and at a frequency of 100 kHz, using a PRECISION IMPEDANCE ANALYZER (4294A) and DIELECTRIC TEST FIXTURE manufactured by Agilent Technologies, Inc.

7-3. Inventive Examples 4 to 7

A capacitive touch panel was prepared by: attaching the high-dielectric pressure-sensitive adhesive A to the cover glass (thickness: 1000 μm, dielectric constant: 7.4) and to one surface of the first transparent film (thickness: 200 μm, dielectric constant: 3.1) on which a transparent conductive electrode pattern is formed (i.e., one surface of the receiving-side ITO electrode layer), so as to serve as a 100 μm-thick first transparent inter-layer resin; and attaching the low-dielectric pressure-sensitive adhesive A to the other surface of the first transparent film on a side opposite to the transparent conductive electrode pattern of the receiving-side ITO electrode layer, and to one surface of the second transparent film on which a transparent conductive electrode pattern is formed (i.e., one surface of the transmitting-side ITO electrode layer), so as to serve as a 50 μm-thick second transparent inter-layer resin (Inventive Example 4).

Similarly, three other different capacitive touch panels were prepared by combining two types of high-dielectric pressure-sensitive adhesives and two types of low-dielectric pressure-sensitive adhesives, presented in Table 2, (Inventive Examples 5 to 7).

The dielectric constant of each of the first and second transparent inter-layer resins was measured. Further, for each of the capacitive touch panels obtained in these Inventive Examples, the capacitance change rate was measured in the same manner as that in Inventive Example 1. A result of the measurement is presented in Table 2.

7-4. Comparative Examples 2 to 4

In the same manner as that in Inventive Example 4, three different capacitive touch panels were prepared using 100 μm-thick first transparent inter-layer resins and 50 μm-thick second transparent inter-layer resins obtained by combining two high-dielectric pressure-sensitive adhesives of the same type and a combination of a high-dielectric pressure-sensitive adhesive and a low-dielectric pressure-sensitive adhesive, presented in Table 3 (Comparative Examples 2 to 4). In the same manner as that in Inventive Example 4, the dielectric constant of each of the first and second transparent inter-layer resins was measured, and, for each of the capacitive touch panels obtained in these Comparative Examples, the capacitance change rate was measured in the same manner as that in Inventive Example 1. A result of the measurement is presented in Table 3.

TABLE 2

|  | Inventive Example 4 | Inventive Example 5 | Inventive Example 6 | Inventive Example 7 |
| --- | --- | --- | --- | --- |
| First transparent inter-layer resin | High-dielectric adhesive A | High-dielectric adhesive B | High-dielectric adhesive A | High-dielectric adhesive B |
| Dielectric constant | 7.4 | 5.4 | 7.4 | 5.4 |

TABLE 2-continued

|  | Inventive Example 4 | Inventive Example 5 | Inventive Example 6 | Inventive Example 7 |
| --- | --- | --- | --- | --- |
| Second transparent inter-layer resin | Low-dielectric adhesive A | Low-dielectric adhesive A | Low-dielectric adhesive B | Low-dielectric adhesive B |
| Dielectric constant | 2.8 | 2.8 | 3.7 | 3.7 |
| ΔC (%) | 22.6 | 22.2 | 21.6 | 21.5 |

TABLE 3

|  | Comparative Example 2 | Comparative Example 3 | Comparative Example 4 |
| --- | --- | --- | --- |
| First transparent inter-layer resin | High-dielectric adhesive B | High-dielectric adhesive A | Low-dielectric adhesive A |
| Dielectric constant | 5.4 | 7.4 | 2.8 |
| Second transparent inter-layer resin | High-dielectric adhesive B | High-dielectric adhesive A | High-dielectric adhesive A |
| Dielectric constant | 5.4 | 7.4 | 7.4 |
| ΔC (%) | 20.7 | 20.3 | 19.5 |

From the results presented in Table 2, in the case of using the inter-layer pressure-sensitive adhesive, it was also verified that, when the first inter-layer filling resin has a dielectric constant greater than that of the second inter-layer filling resin, the capacitance change rate (ΔC) during finger touch is increased.

INDUSTRIAL APPLICABILITY

The present invention makes it possible to provide a capacitive touch panel having enhanced sensitivity and usable in an image display panel, etc.

EXPLANATION OF CODES

1: window
2: first transparent inter-layer resin
3: first transparent conductive electrode pattern
4: first transparent film
5: second transparent inter-layer resin
6: second transparent conductive electrode pattern
7: second transparent film

What is claimed is:
1. A capacitive touch panel comprising:
a window;
a first transparent film having a first transparent conductive electrode pattern formed on one surface thereof;
a second transparent film having a second transparent conductive electrode pattern formed on one surface thereof and disposed with respect to the first transparent film in such a manner as to allow a capacitance to be formed therebetween, are stacked in turn;
a first transparent inter-layer resin provided between the window and the first transparent film, the first transparent inter-layer resin is in direct contact with the first transparent film, and a surface of the first transparent conductive electrode pattern farthest from the window is coplanar with a surface of the first transparent inter-layer resin farthest from the window; and
a second transparent inter-layer resin provided between the first transparent film and the second transparent film, wherein the first transparent inter-layer resin has a dielectric constant greater than that of the second transparent inter-layer resin.

2. The capacitive touch panel as defined in claim 1, wherein each of the dielectric constant of the first transparent inter-layer resin and the dielectric constant of the second transparent inter-layer resin is in the range of 2 to 8.

3. The capacitive touch panel as defined in claim 1, wherein the dielectric constant of the first transparent inter-layer resin is greater than the dielectric constant of the second transparent inter-layer resin by at least 30% thereof.

4. The capacitive touch panel as defined in claim 1, wherein each of the first transparent inter-layer resin and the second transparent inter-layer resin has a thickness of 25 μm or more.

5. The capacitive touch panel as defined in claim 1, wherein the first transparent conductive electrode pattern is formed on a surface of the first transparent film between the first transparent film and the window, and the second transparent conductive electrode pattern is formed on a surface of the second transparent film between the second transparent film and the window.

6. The capacitive touch panel as defined in claim 1, wherein the first transparent conductive electrode pattern is formed on a surface of the first transparent film between the first transparent film and the window, and the second transparent conductive electrode pattern is formed on a surface of the second transparent film on a side opposite to the window.

7. The capacitive touch panel as defined in claim 1, wherein at least one of the first transparent inter-layer resin and the second transparent inter-layer resin is a cured body of an ultraviolet-curable liquid resin.

8. The capacitive touch panel as defined in claim 7, wherein the ultraviolet-curable liquid resin has a viscosity of 100,000 mPa·s to 500 mPa·s.

9. The capacitive touch panel as defined in claim 7, wherein the ultraviolet-curable liquid resin is comprised of an ultraviolet-curable optical resin adhesive composition comprising: a urethane acrylate-based polymer containing a (meth)acryloyl group and a hydroxyl group on side chains thereof; and a photopolymerization initiator.

10. The capacitive touch panel as defined in claim 9, wherein the urethane acrylate-based polymer has a weight-average molecular weight of 5,000 to 500,000.

11. The capacitive touch panel as defined in claim 9, wherein the ultraviolet-curable optical resin adhesive composition further comprises a monofunctional (meth)acrylate compound as a reactive diluent.

12. The capacitive touch panel as defined in claim 9, wherein a mixing amount of the photopolymerization initiator is in the range of 0.1 to 30 weight % with respect to an entirety of the ultraviolet-curable optical resin adhesive composition.

13. The capacitive touch panel as defined in claim 1, wherein, at least one of the first transparent inter-layer resin and the second transparent inter-layer resin is composed of a pressure-sensitive adhesive.

14. The capacitive touch panel as defined in claim 13, wherein the pressure-sensitive adhesive is selected from the group consisting of an acryl-based pressure-sensitive adhesive, a rubber-based pressure-sensitive adhesive, a vinyl alkyl ether-based pressure-sensitive adhesive, a silicone-based pressure-sensitive adhesive, a polyester-based pressure-sensitive adhesive, a polyamide-based pressure-sensitive adhesive, a urethane-based pressure-sensitive adhesive, a fluorine-based pressure-sensitive adhesive, an epoxy-based pressure-sensitive adhesive, a polyether-based pressure-sensitive adhesive, and mixtures thereof.

15. The capacitive touch panel as defined in claim 13, wherein the first transparent inter-layer resin is composed of a pressure-sensitive adhesive, and wherein the pressure-sensitive adhesive of the first transparent inter-layer resin comprises a polymer formed from a monomer component selected from the group consisting of (meth)acrylate, methyl acrylate, ethyl acrylate and butyl acrylate each containing an alkoxyl group and/or a hydroxyl group.

16. The capacitive touch panel as defined in claim 13, wherein the second transparent inter-layer resin is composed of a pressure-sensitive adhesive, and wherein the pressure-sensitive adhesive of the second transparent inter-layer resin comprises a polymer formed from a monomer component which is one or more selected from the group consisting of: an alkyl acrylate ester containing a straight- or branched-chain alkyl group of 6 to 10 carbon atoms; an alkyl methacrylate ester containing a straight- or branched-chain alkyl group of 1 to 10 carbon atoms; a (meth)acrylate ester containing an aromatic or alicyclic hydrocarbon group; a nitrogen-containing monomer; and a fluorine-containing monomer.

17. The capacitive touch panel as defined in claim 13 wherein each of the first transparent inter-layer resin and the second transparent inter-layer resin has a total light transmittance of 90% or more in a visible light wavelength region.

18. The capacitive touch panel as defined in claim 13, wherein each of the first transparent inter-layer resin and the second transparent inter-layer resin has a haze of 3% or less.

19. An image display panel comprising the capacitive touch panel as defined in claim 1, and a liquid crystal panel laminated to the capacitive touch panel.

20. An image display panel comprising the capacitive touch panel as defined in claim 1, and an organic EL panel laminated to the capacitive touch panel.

* * * * *